United States Patent
Abatchev et al.

(10) Patent No.: US 8,486,610 B2
(45) Date of Patent: *Jul. 16, 2013

(54) MASK MATERIAL CONVERSION

(75) Inventors: Mirzafer K. Abatchev, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 136 days.

This patent is subject to a terminal disclaimer.

(21) Appl. No.: 13/024,166

(22) Filed: Feb. 9, 2011

(65) Prior Publication Data

US 2011/0130006 A1  Jun. 2, 2011

Related U.S. Application Data

(62) Division of application No. 10/932,993, filed on Sep. 1, 2004, now Pat. No. 7,910,288.

(51) Int. Cl.
*G03F 7/26* (2006.01)

(52) U.S. Cl.
USPC .......................................... 430/313; 430/311

(58) Field of Classification Search
USPC .................................. 430/311, 313
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,570,325 A | 2/1986 | Higuchi | |
| 4,648,937 A | 3/1987 | Ogura et al. | |
| 4,716,131 A | 12/1987 | Okazawa et al. | |
| 4,776,922 A | 10/1988 | Bhattacharyya et al. | |
| 4,803,181 A | 2/1989 | Buchmann et al. | |
| 4,838,991 A | 6/1989 | Cote et al. | |
| 5,013,680 A | 5/1991 | Lowrey et al. | |
| 5,047,117 A | 9/1991 | Roberts | |
| 5,053,105 A | 10/1991 | Fox, III | |
| 5,117,027 A | 5/1992 | Bernhardt et al. | |
| 5,328,810 A | 7/1994 | Lowrey et al. | |
| 5,330,879 A | 7/1994 | Dennison | |
| 5,470,661 A | 11/1995 | Bailey et al. | |
| 5,514,885 A | 5/1996 | Myrick | |
| 5,593,813 A | 1/1997 | Kim | |
| 5,628,917 A | 5/1997 | MacDonald et al. | |
| 5,670,794 A | 9/1997 | Manning | |
| 5,753,546 A | 5/1998 | Koh et al. | |
| 5,789,320 A | 8/1998 | Andricacos et al. | |
| 5,795,830 A | 8/1998 | Cronin et al. | |
| 5,830,332 A | 11/1998 | Babich et al. | |
| 5,858,620 A | 1/1999 | Ishibashi et al. | |
| 5,899,746 A | 5/1999 | Mukai | |
| 5,998,256 A | 12/1999 | Juengling | |
| 6,004,862 A | 12/1999 | Kim et al. | |
| 6,010,946 A | 1/2000 | Hisamune et al. | |
| 6,020,255 A | 2/2000 | Tsai et al. | |
| 6,042,998 A | 3/2000 | Brueck et al. | |
| 6,057,573 A | 5/2000 | Kirsch et al. | |
| 6,063,688 A | 5/2000 | Doyle et al. | |
| 6,071,789 A | 6/2000 | Yang et al. | |
| 6,110,837 A | 8/2000 | Linliu et al. | |
| 6,143,476 A | 11/2000 | Ye et al. | |
| 6,207,490 B1 | 3/2001 | Lee et al. | |
| 6,211,044 B1 | 4/2001 | Xiang et al. | |
| 6,288,454 B1 | 9/2001 | Allman et al. | |
| 6,291,334 B1 | 9/2001 | Somekh | |
| 6,297,554 B1 | 10/2001 | Lin | |
| 6,335,257 B1 | 1/2002 | Tseng | |
| 6,348,380 B1 | 2/2002 | Weimer et al. | |
| 6,362,057 B1 | 3/2002 | Taylor, Jr. et al. | |
| 6,383,907 B1 | 5/2002 | Hasegawa et al. | |
| 6,395,613 B1 | 5/2002 | Juengling | |
| 6,423,474 B1 | 7/2002 | Holscher | |

(Continued)

FOREIGN PATENT DOCUMENTS

| DE | 42 36 609 | 5/1994 |
|---|---|---|
| EP | 0 227 303 | 7/1987 |

(Continued)

OTHER PUBLICATIONS

Bergeron, et al., "Resolution Enhancement Techniques for the 90nm Technology Node and Beyond," Future Fab International, Issue 15, Jul. 11, 2003, 4 pages.

(Continued)

*Primary Examiner* — Kathleen Duda
(74) *Attorney, Agent, or Firm* — Knobbe, Martens, Olson & Bear LLP

(57) ABSTRACT

The dimensions of mask patterns, such as pitch-multiplied spacers, are controlled by controlled growth of features in the patterns after they are formed. To form a pattern of pitch-multiplied spacers, a pattern of mandrels is first formed overlying a semiconductor substrate. Spacers are then formed on sidewalls of the mandrels by depositing a blanket layer of material over the mandrels and preferentially removing spacer material from horizontal surfaces. The mandrels are then selectively removed, leaving behind a pattern of free-standing spacers. The spacers comprise a material, such as polysilicon and amorphous silicon, known to increase in size upon being oxidized. The spacers are oxidized to grow them to a desired width. After reaching the desired width, the spacers can be used as a mask to pattern underlying layers and the substrate. Advantageously, because the spacers are grown by oxidation, thinner blanket layers can be deposited over the mandrels, thereby allowing the deposition of more conformal blanket layers and widening the process window for spacer formation.

21 Claims, 27 Drawing Sheets

U.S. PATENT DOCUMENTS

| | | |
|---|---|---|
| 6,455,372 B1 | 9/2002 | Weimer |
| 6,475,867 B1 | 11/2002 | Hui et al. |
| 6,500,756 B1 | 12/2002 | Bell et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,620,715 B1 | 9/2003 | Blosse et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,762,449 B2 | 7/2004 | Uchiyama et al. |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,818,141 B1 | 11/2004 | Plat et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,916,594 B2 | 7/2005 | Bok |
| 6,924,191 B2 | 8/2005 | Liu et al. |
| 6,955,961 B1 | 10/2005 | Chung |
| 6,962,867 B2 | 11/2005 | Jackson et al. |
| 7,015,124 B1 | 3/2006 | Fisher et al. |
| 7,074,668 B1 | 7/2006 | Park et al. |
| 7,084,076 B2 | 8/2006 | Park et al. |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,378,727 B2 | 5/2008 | Caspary et al. |
| 7,442,976 B2 | 10/2008 | Juengling |
| 7,537,866 B2 | 5/2009 | King Liu |
| 7,851,135 B2 | 12/2010 | Jung |
| 2001/0005631 A1 | 6/2001 | Kim et al. |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura |
| 2003/0006410 A1 | 1/2003 | Doyle |
| 2003/0044722 A1 | 3/2003 | Hsu et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0234138 A1 | 10/2006 | Fehlhaber et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0018345 A1 | 1/2007 | Chao |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0200178 A1 | 8/2007 | Yun et al. |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0275309 A1 | 11/2007 | Liu |
| 2008/0054350 A1 | 3/2008 | Breitwisch et al. |
| 2008/0292991 A1 | 11/2008 | Wallow |

FOREIGN PATENT DOCUMENTS

| | | |
|---|---|---|
| EP | 0 491 408 | 6/1992 |
| EP | 1 357 433 | 10/2003 |
| JP | 57-048237 | 3/1982 |
| JP | 64-035916 | 2/1989 |
| JP | 05-343370 | 12/1993 |
| JP | 06-045431 | 2/1994 |
| JP | H8-55908 | 2/1996 |
| JP | H8-55920 | 2/1996 |
| JP | 2000-208434 | 7/2000 |
| JP | 2000-357736 | 12/2000 |
| JP | 2001-110782 | 4/2001 |
| JP | 2002-194547 | 7/2002 |
| JP | 2004-080033 | 3/2004 |
| JP | 2004-152784 | 5/2004 |
| JP | 2005-150333 | 6/2005 |
| JP | 2006-351861 | 1/2012 |
| KR | 1999-001440 | 1/1999 |
| KR | 1999-027887 | 4/1999 |
| WO | WO 94/15261 | 7/1994 |
| WO | WO 02/099864 | 12/2002 |
| WO | WO 2004/001799 | 12/2003 |
| WO | WO 2004/003977 | 1/2004 |
| WO | WO 2005/010973 | 2/2005 |
| WO | WO 2005/034215 | 4/2005 |
| WO | WO 2006/026699 | 3/2006 |

OTHER PUBLICATIONS

Bhave et al. "Developer-soluble Gap fill materials for patterning metal trenches in Via-first Dual Damascene process," preprint of Proceedings of SPIE: Advances in Resist Technology and Processing XXI, vol. 5376, 2004, John L. Sturtevant, editor, 8 pages.

Bruek, "Optical and Interferometric Lithography—Nanotechnology Enablers," 2005, Proceedings of the IEEE, vol. 93, No. 10, pp. 1704-1721.

Choi et al. "Sublithographic nanofabrication technology for nanocatalysts and DNA chips," *J. Vac. Sci. Technol.*, Nov./Dec. 2003; pp. 2951-2955.

Chung et al. "Nanoscale Multi-Line Patterning Using Sidewall Structure," Jpn., J. App.. Phys. vol. 41 (2002) Pt. 1, No. 6B, pp. 4410-4414.

Chung et al. "Pattern multiplication method and the uniformity of nanoscale multiple lines," J.Vac.Sci.Technol. B21(4), Jul./Aug. 2003, pp. 1491-1495.

U.S. Appl. No. 11/543,515, filed Oct. 24, 2006, MICRON Ref. No. 2005-1173.00/US.

Decision of Rejection, and its English translation, issued Jan. 11, 2011 in counterpart Japanese Patent Application No. 2007-530053.

"*Ex parte Cantell*, unpublished decision of the Board of Patent Appeals and Interferences, Mar. 4, 2005".

Final Office Action issued Mar. 29, 2010 in U.S. Appl. No. 11/669,840.

Joubert et al. "Nanometer scale linewidth control during etching of polysilicon gates in high-density plasmas," Microelectronic Engineering 69 (2003), pp. 350-357.

Notice of Rejection Grounds issued Aug. 17, 2010 in corresponding Japanese Patent Application No. 2007-530053.

Oehrlein et al. "Pattern transfer into low dielectic materials by high-density plasma etching," Solid State Tech., May 2000, 8 pages.

Sheats et al., "Microlithography: Science and Technology," 1998, Marcel Dekkar, Inc., pp. 104-105.

Office Action of May 15, 2008 in U.S. Appl. No. 11/492,513, filed Jul. 24, 2006.

Office Action of Jun. 2, 2008 in U.S. Appl. No. 11/219,067, filed Sep. 1, 2005.

Office Action of Jun. 3, 2008 in U.S. Appl. No. 11/492,323, filed Jul. 24, 2006.

Office Action of Jun. 5, 2008 in U.S. Appl. No. 11/514,117, filed Aug. 30, 2006.

Office Action of Jul. 11, 2008 in U.S. Appl. No. 11/367,020, filed Mar. 2, 2006.

European Office Action dated Apr. 19, 2011 in European Patent Application No. 05 790 231.4-1235.

Cerofolini et al., "Strategies for nanoelectronics", *Microelectronic Engineering*, vol. 81, pp. 405-419.

MASK MATERIAL CONVERSION

PRIORITY APPLICATION

This application is a divisional of U.S. patent application Ser. No. 10/932,993, filed Sep. 1, 2004.

REFERENCE TO RELATED APPLICATIONS

This application is related to the following: U.S. patent application Ser. No. 10/931,772 to Abatchev et al., filed Aug. 31, 2004, entitled Critical Dimension Control, U.S. patent application Ser. No. 10/934,778 to Abatchev et al., entitled Method for Integrated Circuit Fabrication Using Pitch Multiplication, U.S. patent application Ser. No. 10/931,771 to Tran et al., filed Aug. 31, 2004, entitled Methods for Increasing Photo-Alignment Margins, and U.S. patent application Ser. No. 10/934,317 to Sandhu et al., entitled Methods to Align Mask Patterns.

BACKGROUND OF THE INVENTION

1. Field of the Invention

This invention relates generally to integrated circuit fabrication and, more particularly, to masking techniques.

2. Description of the Related Art

As a consequence of many factors, including demand for increased portability, computing power, memory capacity and energy efficiency in modern electronics, integrated circuits are continuously being reduced in size. To facilitate this size reduction, the sizes of the constituent features, such as electrical devices and interconnect line widths, that form the integrated circuits are also constantly being decreased.

The trend of decreasing feature size is evident, for example, in memory circuits or devices such as dynamic random access memories (DRAMs), static random access memories (SRAMs), ferroelectric (FE) memories, etc. To take one example, DRAM typically comprises millions of identical circuit elements, known as memory cells. In its most general form, a memory cell typically consists of two electrical devices: a storage capacitor and an access field effect transistor. Each memory cell is an addressable location that can store one bit (binary digit) of data. A bit can be written to a cell through the transistor and read by sensing charge on the storage electrode from the reference electrode side. By decreasing the sizes of constituent electrical devices and the conducting lines that access them, the sizes of the memory devices incorporating these features can be decreased. Additionally, storage capacities can be increased by fitting more memory cells into the memory devices.

The continual reduction in feature sizes places ever greater demands on techniques used to form the features. For example, photolithography is commonly used to pattern features, such as conductive lines, on a substrate. The concept of pitch can be used to describe the size of these features. Pitch is defined as the distance between an identical point in two neighboring features. These features are typically defined by spaces between adjacent features, which are typically filled by a material, such as an insulator or conductor. As a result, pitch can be viewed as the sum of the width of a feature and of the width of the space separating that feature from a neighboring feature. Due to factors such as optics and light or radiation wavelength, however, photolithography techniques each have a minimum pitch below which a particular photolithographic technique cannot reliably form features. Thus, the minimum pitch of a photolithographic technique can limit feature size reduction.

"Pitch doubling" is one method proposed for extending the capabilities of photolithographic techniques beyond their minimum pitch. Such a method is illustrated in FIGS. 1A-1F and described in U.S. Pat. No. 5,328,810, issued to Lowrey et al., the entire disclosure of which is incorporated herein by reference. With reference to FIG. 1A, photolithography is first used to form a pattern of lines 10 in a photoresist layer overlying a layer 20 of an expendable material and a substrate 30. As shown in FIG. 1B, the pattern is then transferred by an etch step (preferably anisotropic) to the layer 20, forming placeholders, or mandrels, 40. The photoresist lines 10 can be stripped and the mandrels 40 can be isotropically etched to increase the distance between neighboring mandrels 40, as shown in FIG. 1C. A layer 50 of material is subsequently deposited over the mandrels 40, as shown in FIG. 1D. Spacers 60, i.e., material extending or originally formed extending from sidewalls of another material, are then formed on the sides of the mandrels 40 by preferentially etching the spacer material from the horizontal surfaces 70 and 80 in a directional spacer etch, as shown in FIG. 1E. The remaining mandrels 40 are then removed, leaving behind only the spacers 60, which together act as an etch mask for patterning underlying layers, as shown in FIG. 1F. Thus, where a given pitch formerly included a pattern defining one feature and one space, the same width now includes two features and two spaces defined by the spacers 60. As a result, the smallest feature size possible with a photolithographic technique is effectively decreased.

It will be appreciated that while the pitch is actually halved in the example above, this reduction in pitch is conventionally referred to as pitch "doubling," or, more generally, pitch "multiplication." That is, conventionally "multiplication" of pitch by a certain factor actually involves reducing the pitch by that factor. The conventional terminology is retained herein.

The critical dimension of a feature is the feature's minimum dimension. For features formed using the spacers 60, the critical dimension typically corresponds to the width of the spacers. The width of the spacers, in turn, is typically dependent upon a thickness 90 (see FIGS. 1D and 1E) of the layer 50. Thus, the layer 50 is typically formed to a thickness 90 corresponding to the desired critical dimension.

The quality and uniformity of the spacers 60 directly affect the quality of the integrated circuits partially defined in the substrate 30 using the spacers as a mask. Where the desired spacers 60 are relatively wide compared to the mandrels 40 and/or the space separating the spacers 60, however, it has been observed that the resulting spacers 60 and the etch mask resulting from the spacers 60 can have poor uniformity. This poor uniformity, in turn, can cause poorly defined and non-uniform features to be formed in the substrate. As a result, the electrical performance of integrated circuits formed in the substrate may be degraded or the integrated circuits may be unusable.

Accordingly, there is a need for methods of forming etch masks having highly uniform and well-defined patterns, especially in conjunction with spacers formed in pitch multiplication.

SUMMARY OF THE INVENTION

According to one aspect of the invention, a method is provided for fabricating an integrated circuit. The method comprises providing a substrate having an overlying mask layer. The mask layer comprises mask material and openings which form a pattern. The mask material is oxidized and the pattern is subsequently transferred to the substrate.

According to another aspect of the invention, a process is provided for forming an integrated circuit. The process comprises providing a pattern comprising a plurality of mask lines in a mask layer overlying a substrate. The mask lines comprise a precursor material. The mask lines are grown to a desired width by chemically reacting the precursor material to form a chemical compound occupying a larger volume than the precursor material.

According to another aspect of the invention, a process is provided for forming an integrated circuit. The process comprises providing a patterned mask layer overlying a substrate. The mask layer comprises a precursor material which is chemically reacted to form an etch stop material. The pattern in the mask layer is subsequently transferred to an underlying layer.

According to yet another aspect of the invention, a method of semiconductor processing is provided. The method comprises providing a substrate. A temporary layer overlies the substrate and a photodefinable layer overlies the temporary layer. A pattern is formed in the photodefinable layer and transferred to the temporary layer to form a plurality of placeholders in the temporary layer. A blanket layer of spacer material is deposited over the plurality of placeholders. The spacer material is selectively removed from horizontal surfaces. The placeholders are selectively removed relative to the spacer material. The spacer material is expanded to a desired size.

According to another aspect of the invention, a process is provided for forming a memory device. The process comprises forming a plurality of mask lines by pitch multiplication. Neighboring mask lines are separated from one another by an open space and the open space between neighboring mask lines is narrowed.

According to yet another aspect of the invention, a method is provided for semiconductor processing. The method comprises forming a plurality of mask lines by pitch multiplication. A volume of material forming the mask lines is expanded to a desired width by converting the material to an other material.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Figure 1A:
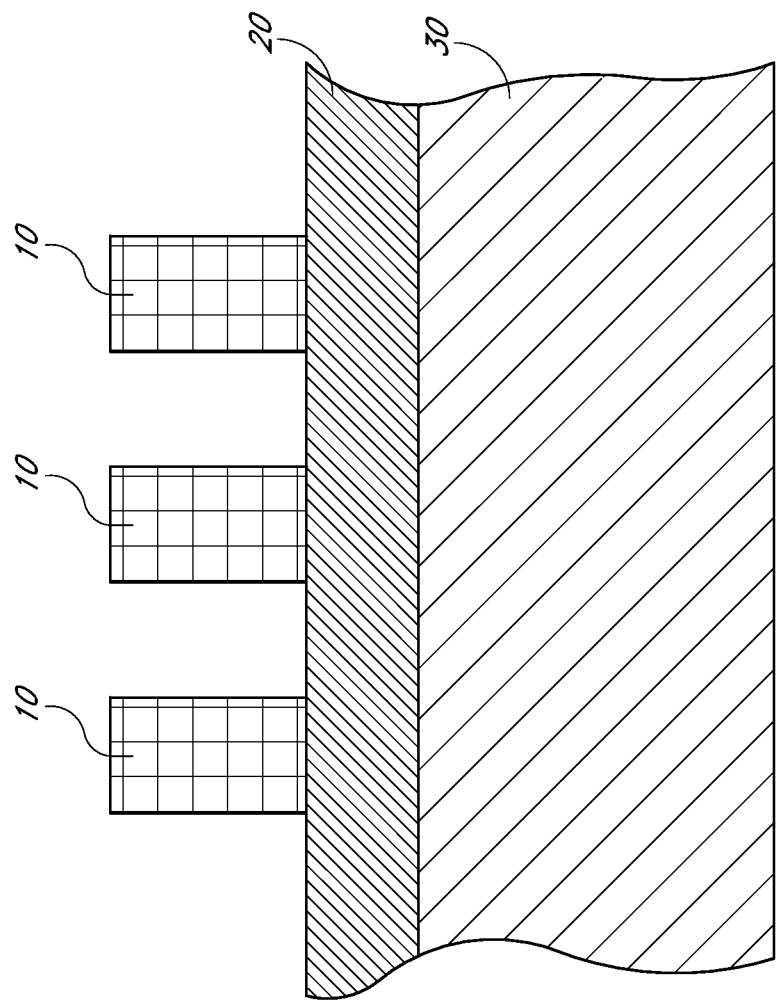
FIGS. 1A-1F are schematic, cross-sectional side views of mask lines, formed in accordance with a prior art pitch multiplication method.
Figure 1B:
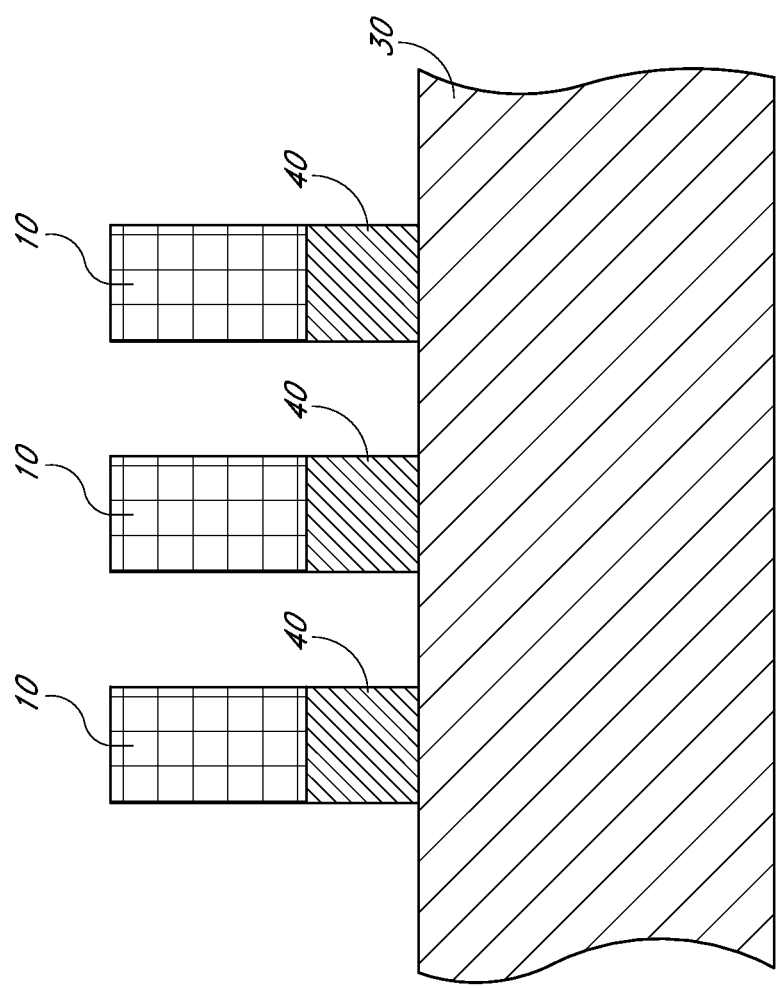
Figure 1C:
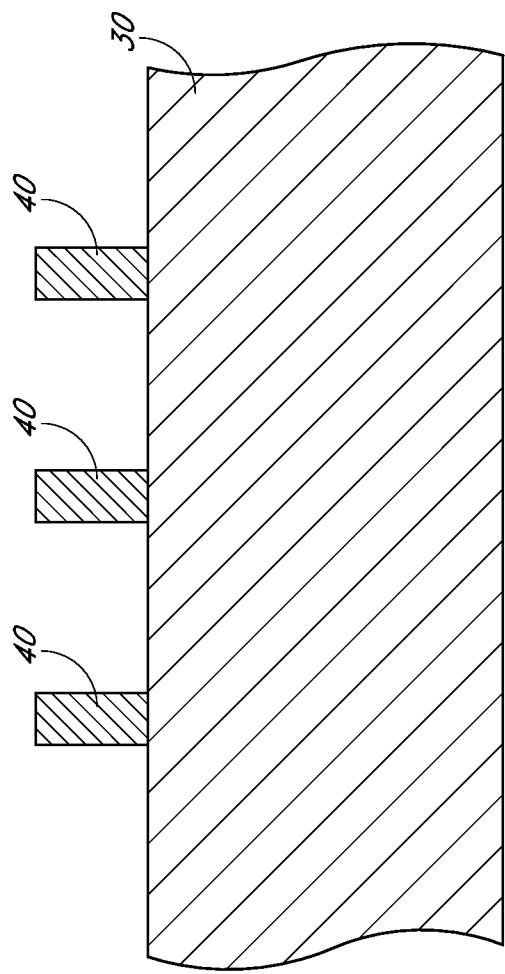
Figure 1D:
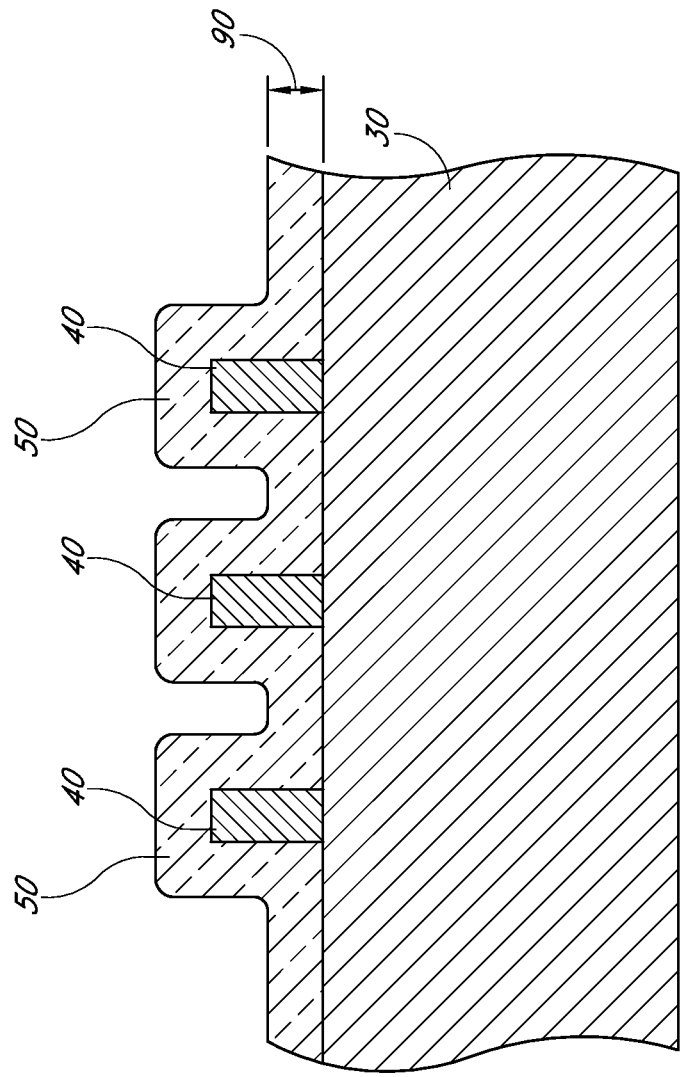
Figure 1E:
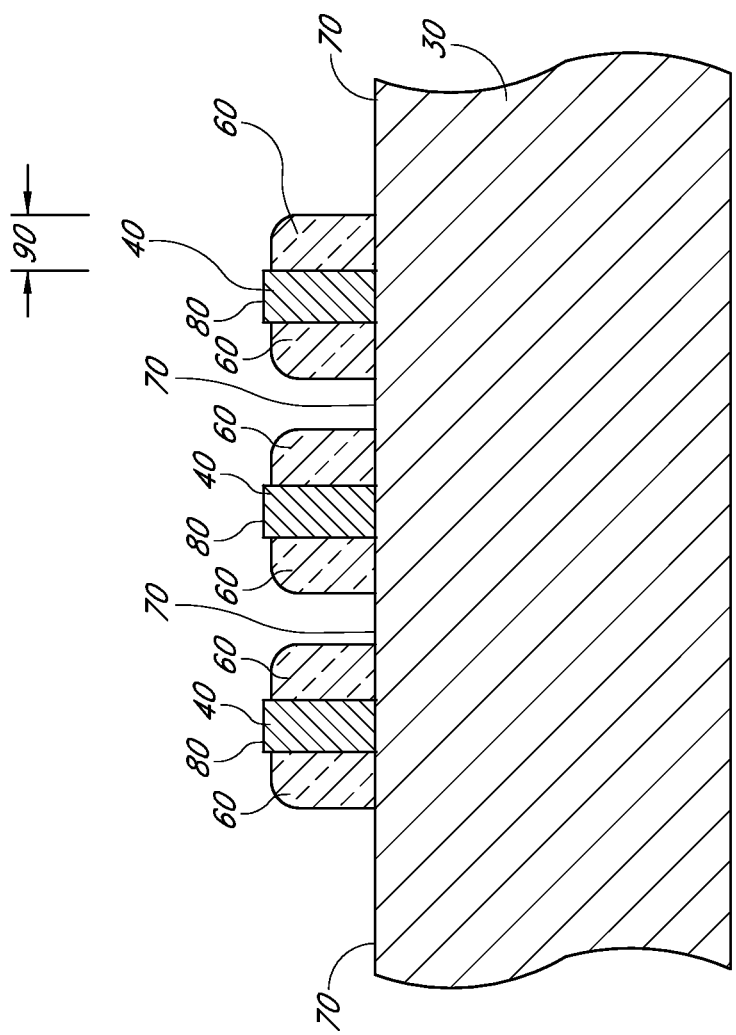
Figure 1F:
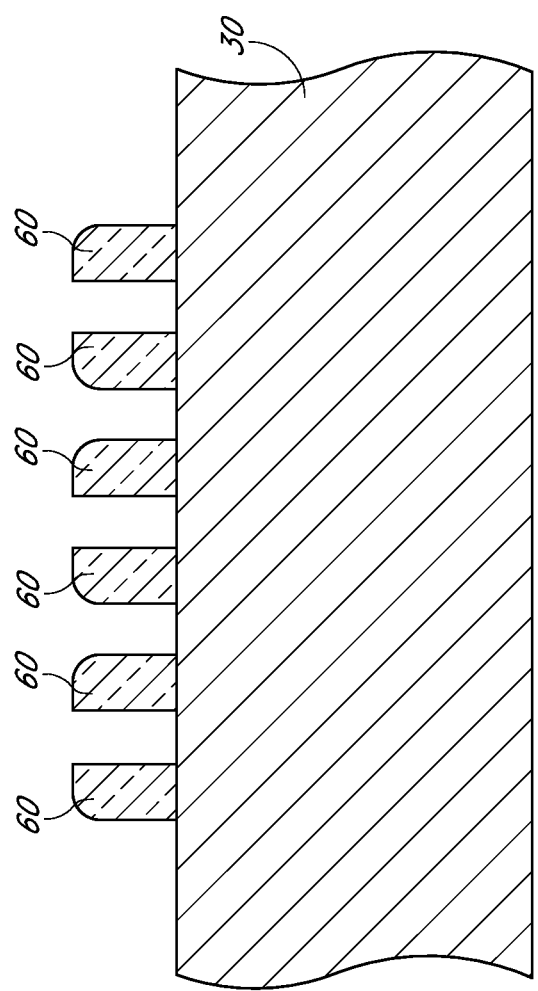

It has been found that the poor quality of some spacer patterns is due to difficulties depositing conformal layers of spacer material and/or etching this material to form spacers. Because spacers are typically formed out of the vertically extending parts of blanket layers of spacer material over a complex mask topography, the conformality of the layers will affect the uniformity, e.g., the widths, the heights and the physical placement, of the spacers formed from the layers. It will be appreciated that the more conformal a layer is, the more closely it replicates the shape of the surface on which it is deposited.

As critical dimensions continue to decrease, however, the aspect ratios of the spaces, or openings, between mandrels continue to increase. This is partly due to the desire to pack features more closely together by reducing the widths of the spaces between mandrels. In addition, in common methods of transferring patterns, both the spacers and an underlying layer are exposed to an etchant, which preferentially etches away the substrate material. The etchants, however, also wear away the spacers, albeit at a slower rate. Thus, even as critical dimensions decrease, the vertical heights of the spacers must remain at a level that allow a pattern transfer to be completed before the spacers are completely worn away by etchants.

Accordingly, deposition of highly conformal layers of spacer material can be increasingly difficult, due in part to increasingly limited diffusion of precursor gases into the bottom portions of the spaces between mandrels. This diffusion becomes increasingly more limited during the course of a deposition, as sidewalls fill in with spacer material, thereby further increasing the aspect ratios of the space between the sidewalls. For this reason, relatively thin layers are more easily and reliably deposited than relatively thick layers. As a result of poor conformality of relatively thick deposited layers, the uniformity of spacers formed from the layers can be also be poor.

In addition, just as it may be difficult for precursors to reach the bottoms of high aspect ratio spaces, the aspect ratios of some spaces can also limit the amount of etchant that penetrates to the bottoms of those spaces. Consequently, when etching laterally extending parts of the layer of spacer material to define individual spacers, some spacer material may undesirably remain at the bottoms of these spaces, causing the formation of spacers having bottom surfaces with widths different from expected widths. Thus, difficulties in depositing and also etching layers of spacer materials make precise control over the widths of the spacers difficult.

Advantageously, preferred embodiments of the invention allow for more precise control over the widths and uniformity of features formed using a mask pattern. In the preferred embodiments, the mask pattern is formed with a material that can itself be increased to a desired size or critical dimension by a subsequent process, such as oxidation. The mask pattern is then subjected to the expansion process to increase the widths of mask features to a desired width. The now-enlarged mask features can then be used to form a pattern in an underlying layer. As used herein, it will be appreciated that a "feature" refers to any volume or opening formed in a material, e.g., in a mask layer or in the substrate, and having discrete boundaries.

Preferably, the pattern subjected to the enlargement process is a pattern of spacers formed by pitch multiplication. The spacers preferably comprise silicon, e.g., polysilicon or amorphous silicon. The enlargement process can be any process that causes the spacers to expand. Where the spacers comprise silicon, the expansion process preferably comprises oxidation of the spacers to form silicon oxide. Moreover, the spacers are oxidized until they grow to a desired width. After growing to the desired width, the spacers can be used to pattern features in underlying layers. Optionally, the spacers can be trimmed to a desired critical dimension after being oxidized.

Advantageously, by growing the spacers to a desired width after they are formed, a thinner layer of spacer material can be deposited. By depositing thinner layers than would otherwise be required for a desired critical dimension, the conformality of the layers is less dependent upon the limitations of the deposition and/or etching process. As a result, the process window for forming spacers of a given critical dimension is widened.

In addition, as noted above, a spacer is typically formed to a particular height that is dictated in part by the requirements of a particular semiconductor process to be performed through the mask (e.g., etching, implantation, doping, oxidation, etc.) and particular materials of the underlying substrate that are to be exposed to the process. For example, spacers are typically formed to a height that accounts for the removal of some material during subsequent etching of an underlying layer. Advantageously, because spacers typically grow both laterally and vertically during, e.g., oxidation, the resulting taller spacers are less likely to be etched away when transferring the spacer pattern to an underlying layer. Also, because the initial height of the spacer formed by a spacer etch is dependent on the height of a mandrel, the mandrel's height can be less than the height that would be required if the spacers were not later enlarged. Consequently, because the height of the mandrels can be reduced, the aspect ratio of the spaces between the mandrels is also reduced, thereby further easing the requirements for the spacer material deposition and further increasing the process window.

It will be appreciated that silicon nitrides and silicon oxides are particularly suitable as spacer materials for mask formation, due in part to the availability of selective etch chemistries relative to a variety of other materials, including metals, oxides and silicon-containing substrates. Advantageously, the conversion of the silicon spacer into a silicon oxide allows preferred embodiments of the invention to be easily inserted into various process flows, especially for pitch multiplication, without needing to substantially alter the process flow. In addition, partial conversion of silicon spacers to silicon oxide still allows selective etch chemistries that will attack, e.g., a carbon mask material without attacking either silicon oxide or residual silicon.

Reference will now be made to the Figures, wherein like numerals refer to like parts throughout. It will be appreciated that FIGS. 2-22 are not necessarily drawn to scale.

It will be also appreciated that, while the preferred embodiments will find application in any context in which it may be desirable to increase the size of the individual parts constituting a mask pattern after those parts are formed, in particularly advantageous embodiments the mask pattern comprises spacers formed by pitch multiplication. Thus, the pitch multiplied features preferably have a pitch below the minimum pitch of the photolithographic technique used for patterning the mandrels used to form the spacers. In addition, while the preferred embodiments can be used to form any integrated circuit, they are particularly advantageously applied to form devices having arrays of electrical devices, including logic or gate arrays and volatile and non-volatile memory devices such as DRAM, ROM or flash memory.

Figure 2:
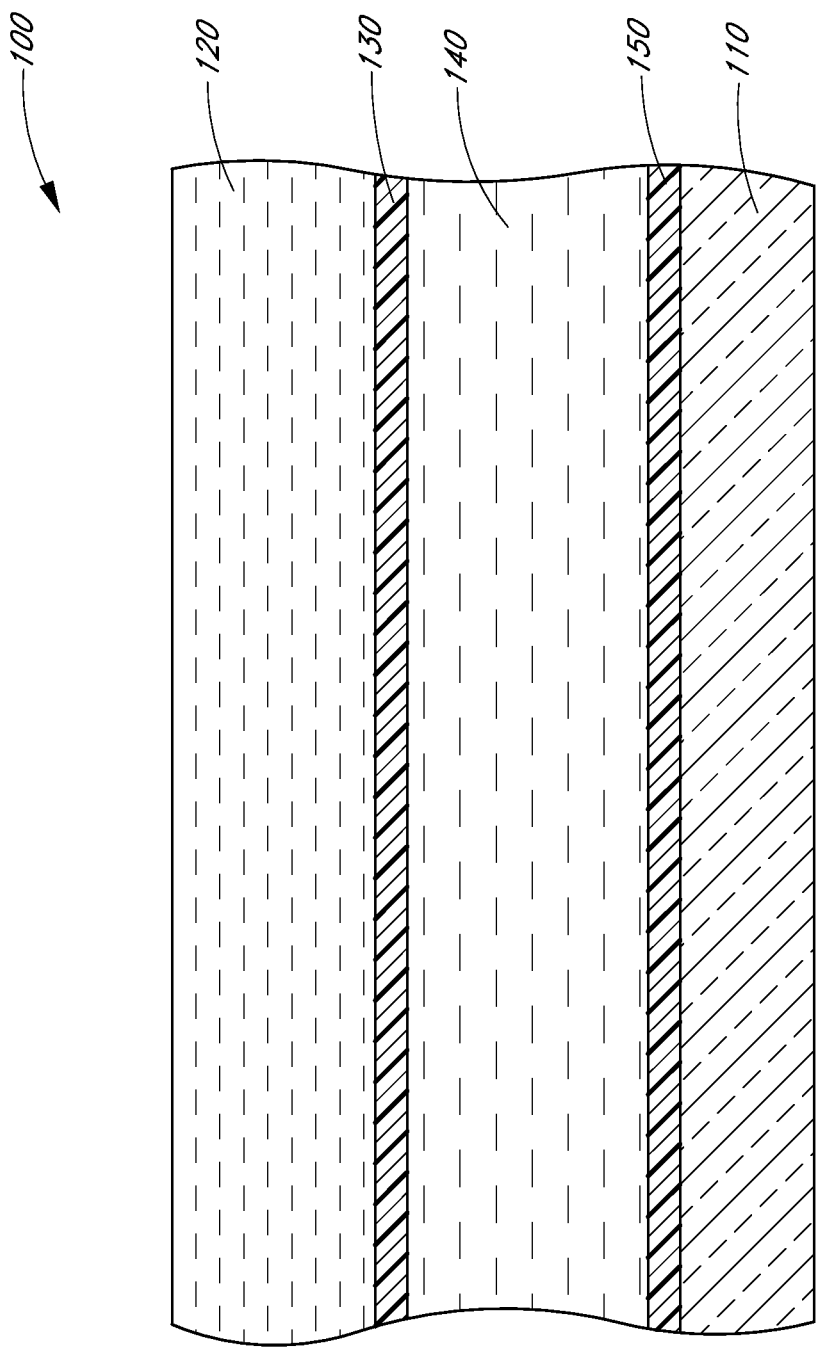
FIG. 2 is a schematic, cross-sectional side view of a partially formed memory device, in accordance with preferred embodiments of the invention.

With reference to FIG. 2, a partially formed integrated circuit 100 is provided. A substrate 110 is provided below various masking layers 120-150. The layers 120-150 will be etched to form a mask for patterning the substrate 110 to form various features, as discussed below.

It will be appreciated that the "substrate" can include a layer of a single material, a plurality of layers of different materials, a layer or layers having regions of different materials or structures in them, etc. These materials can include semiconductors, insulators, conductors, or combinations thereof. For example, the substrate can comprise doped polysilicon, an electrical device active area, a silicide, or a metal layer, such as a tungsten, aluminum or copper layer, or a combination thereof. Thus, the mask features discussed below can directly correspond to the desired placement of conductive features, such as interconnects, in the substrate. In other embodiments, the substrate can be an insulator and the location of mask features can correspond to the desired location of insulators.

The materials for the layers 120-150 overlying the substrate 110 are preferably chosen based upon consideration of the chemistry and process conditions for the various pattern forming and pattern transferring steps discussed herein. Because the layers between a topmost photodefinable layer 120 and the substrate 110 will function to transfer a pattern derived from the photodefinable layer 120 to the substrate 110, the layers between the photodefinable layer 120 and the substrate 110 are preferably chosen so that they can be selectively etched relative to other exposed materials. It will be appreciated that a material is considered selectively, or preferentially, etched when the etch rate for that material is at least about 5 times greater, preferably about 10 times greater and more preferably about 20 times greater than that for surrounding materials.

In the illustrated embodiment, the photodefinable layer 120 overlies a first hard mask, or etch stop, layer 130, which overlies a temporary layer 140, which overlies a second hard mask, or etch stop, layer 150, which overlies the substrate 110 to be patterned, e.g., by etching through the second hard mask layer 150.

The photodefinable layer 120 is preferably formed of a photoresist, including any photoresist known in the art. For example, the photoresist can be any photoresist compatible with 157 nm, 193 nm or 248 nm wavelength systems, 193 nm wavelength immersion systems or electron beam systems. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems.

The material for the first hard mask layer 130 preferably comprises an inorganic material, and exemplary materials include silicon oxide ($SiO_2$), silicon or a dielectric anti-reflective coating (DARC), such as a silicon-rich silicon oxynitride. In the illustrated embodiment, the first hard mask layer 130 is a dielectric anti-reflective coating (DARC). The temporary layer 140 is preferably formed of amorphous carbon, which offers very high etch selectivity relative to the preferred hard mask materials. More preferably, the amorphous carbon is a form of amorphous carbon that is highly transparent to light and which offers further improvements in alignment. Deposition techniques for forming a highly transparent carbon can be found in A. Helmbold, D. Meissner, Thin Solid Films, 283 (1996) 196-203, the entire disclosure of which is incorporated herein by reference.

Because the preferred chemistries for etching photoresist also typically etch significant amounts of amorphous carbon and because chemistries are available for etching amorphous carbon with excellent selectivity relative to a variety of non-photoresist materials, the hard mask layer 130, selected from such materials, preferably separates the layers 120 and 140. As noted above, the first hard mask layer 130 preferably comprises silicon oxide, silicon or a DARC, which can be preferentially removed relative to amorphous carbon.

In addition, using DARCs for the first hard mask layer 130 can be particularly advantageous for forming patterns having pitches near the resolution limits of a photolithographic technique. The DARCs can enhance resolution by minimizing light reflections, which can decrease the precision with which photolithography can define the edges of a pattern. Optionally, a bottom anti-reflective coating (BARC) (not shown) can similarly be used in addition to the first hard mask layer 130 to control light reflections.

The second hard mask layer 150 preferably comprises a dielectric anti-reflective coating (DARC) (e.g., a silicon oxynitride), silicon or aluminum oxide ($Al_2O_3$). In addition, a bottom anti-reflective coating (BARC) (not shown) can optionally be used to control light reflections. In the illustrated embodiment, the second hard mask layer 150 comprises $Al_2O_3$.

In addition to selecting appropriate materials for the various layers, the thicknesses of the layers 120-150 are preferably chosen depending upon compatibility with the etch chemistries and process conditions described herein. For example, when transferring a pattern from an overlying layer to an underlying layer by selectively etching the underlying layer, materials from both layers are removed to some degree. Thus, the upper layer is preferably thick enough so that it is not worn away over the course of the pattern transfer.

In the illustrated embodiment, the photodefinable layer 120 is preferably between about 100 nm and about 300 nm thick and, more preferably, between about 150 nm and about 250 nm thick. The first hard mask layer 130 is preferably between about 10 nm and about 500 nm thick and, more preferably, between about 15 nm and about 300 nm thick. The temporary layer 140 is preferably between about 100 nm and about 300 nm thick and, more preferably, between about 100 nm and about 200 nm thick. The second hard mask layer 150 is preferably between about 10 nm and about 50 nm thick and, more preferably, between about 10 nm and about 30 nm thick.

It will be appreciated that the various layers discussed herein can be formed by various methods known to those of skill in the art. For example, various vapor deposition processes, such as chemical vapor deposition, can be used to form hard mask layers. Spin-on-coating processes can be used to form photodefinable layers. In addition, amorphous carbon layers can be formed by chemical vapor deposition using a hydrocarbon compound, or mixtures of such compounds, as carbon precursors. Exemplary precursors include propylene, propyne, propane, butane, butylene, butadiene and acetelyne. A suitable method for forming amorphous carbon layers is described in U.S. Patent No. 6,573,030 B1, issued to Fairbairn et al. on Jun. 3, 2003, the entire disclosure of which is incorporated herein by reference.

In a first phase of methods in accordance with the preferred embodiments and with reference to FIGS. 3-11, a pattern of spacers is formed by pitch multiplication.

Figure 3:
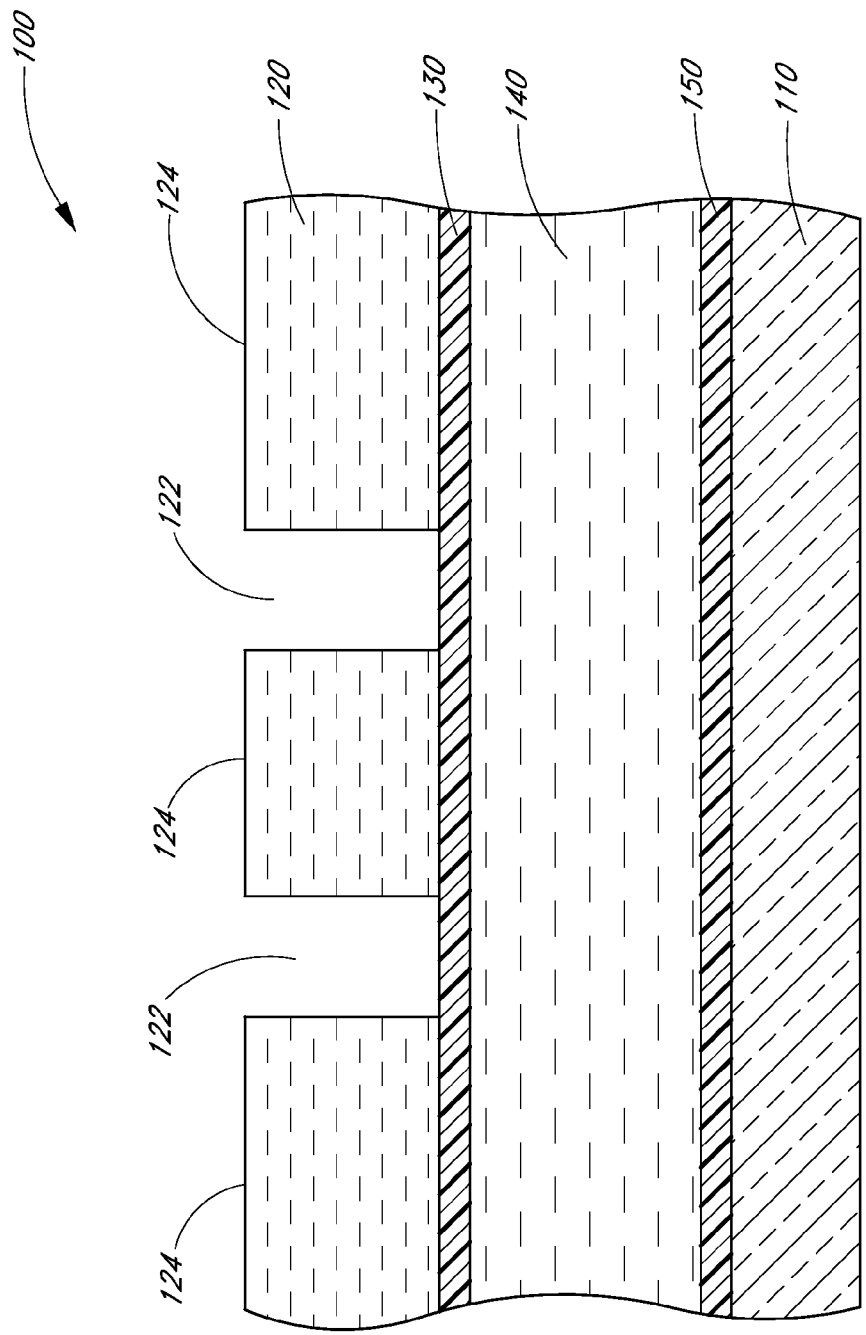
FIG. 3 is a schematic, cross-sectional side view of the partially formed memory device of FIG. 2 after forming lines in a photo-definable layer, in accordance with preferred embodiments of the invention.

With reference to FIG. 3, a pattern comprising spaces or trenches 122 delimited by photodefinable material features 124 is formed in the photodefinable layer 120. The trenches 122 can be formed by, e.g., photolithography, in which the layer 120 is exposed to radiation through a reticle and then developed. After being developed, the remaining photodefinable material, photoresist in the illustrated embodiment, forms features such as the illustrated lines 124 (shown in cross-section only).

The pitch of the resulting lines 124 and spaces 122 is equal to the sum of the width of a line 124 and the width of a neighboring space 122. To minimize the critical dimensions of features formed using this pattern of lines 124 and spaces 122, the pitch is preferably at or near the limits of the photolithographic technique used to pattern the photodefinable layer 120. Thus, the pitch may be at the minimum pitch of the photolithographic technique and the spacer pattern discussed below can advantageously have a pitch below the minimum pitch of the photolithographic technique.

Figure 4:
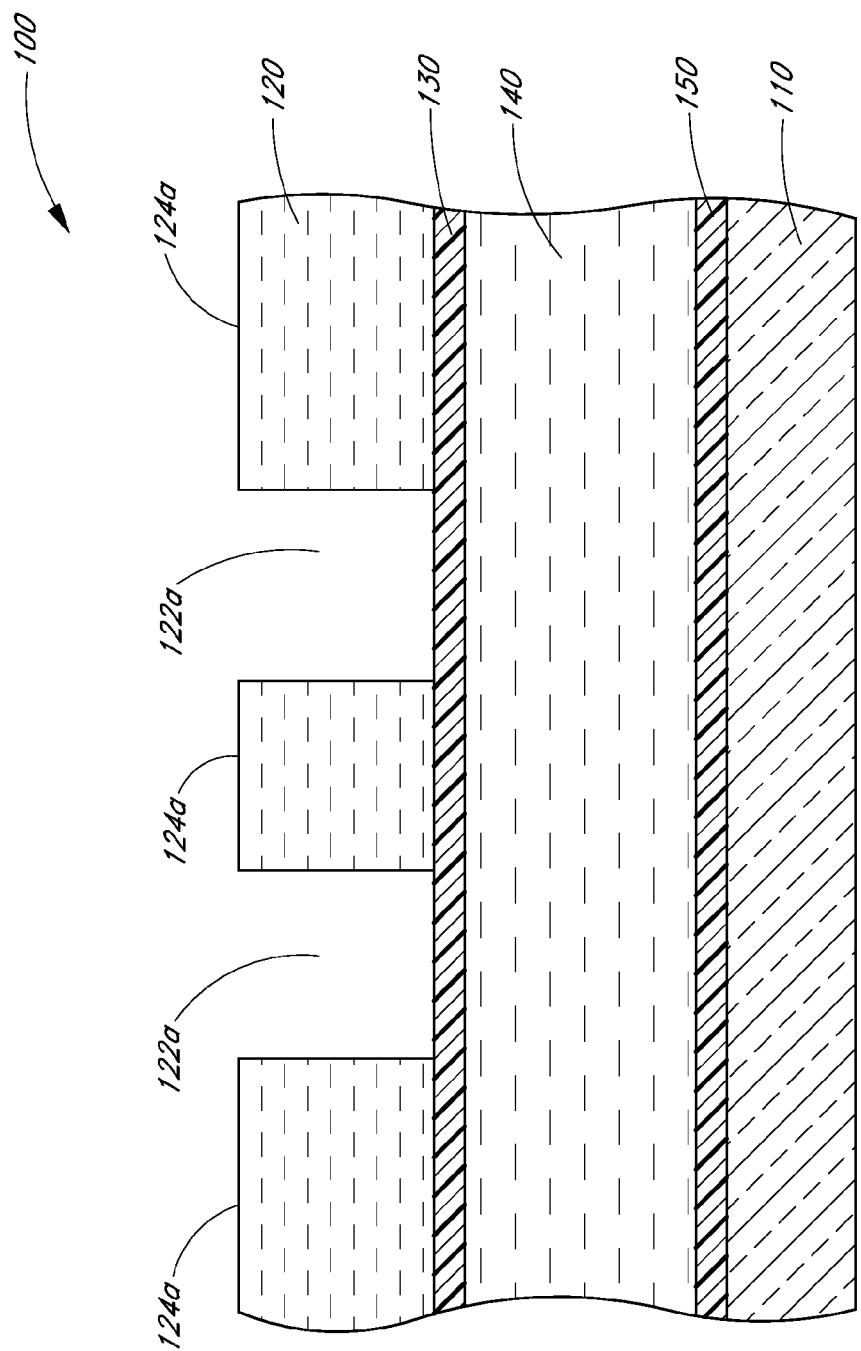
FIG. 4 is a schematic, cross-sectional side view of the partially formed memory device of FIG. 3 after widening spaces between photoresist lines, in accordance with preferred embodiments of the invention.

As shown in FIG. 4, the spaces 122 can optionally be widened by etching the photoresist lines 124, to form modified spaces 122a and lines 124a. The photoresist lines 124 are preferably etched using an isotropic etch, such as a sulfur oxide plasma, e.g., a plasma comprising $SO_2$, $O_2$, $N_2$ and Ar. The extent of the etch is preferably selected so that the widths of the spaces 122a and the lines 124a are substantially equal to the desired spacing between the later-formed spacers, as will be appreciated from the discussion of FIGS. 8-10 below. Advantageously, this etch allows the lines 124a to be narrower than would be possible with using the photolithographic technique used to pattern the photodefinable layer 120. In addition, the etch can smooth the edges of the lines 124a, thus improving the uniformity of those lines 124a.

Figure 7:
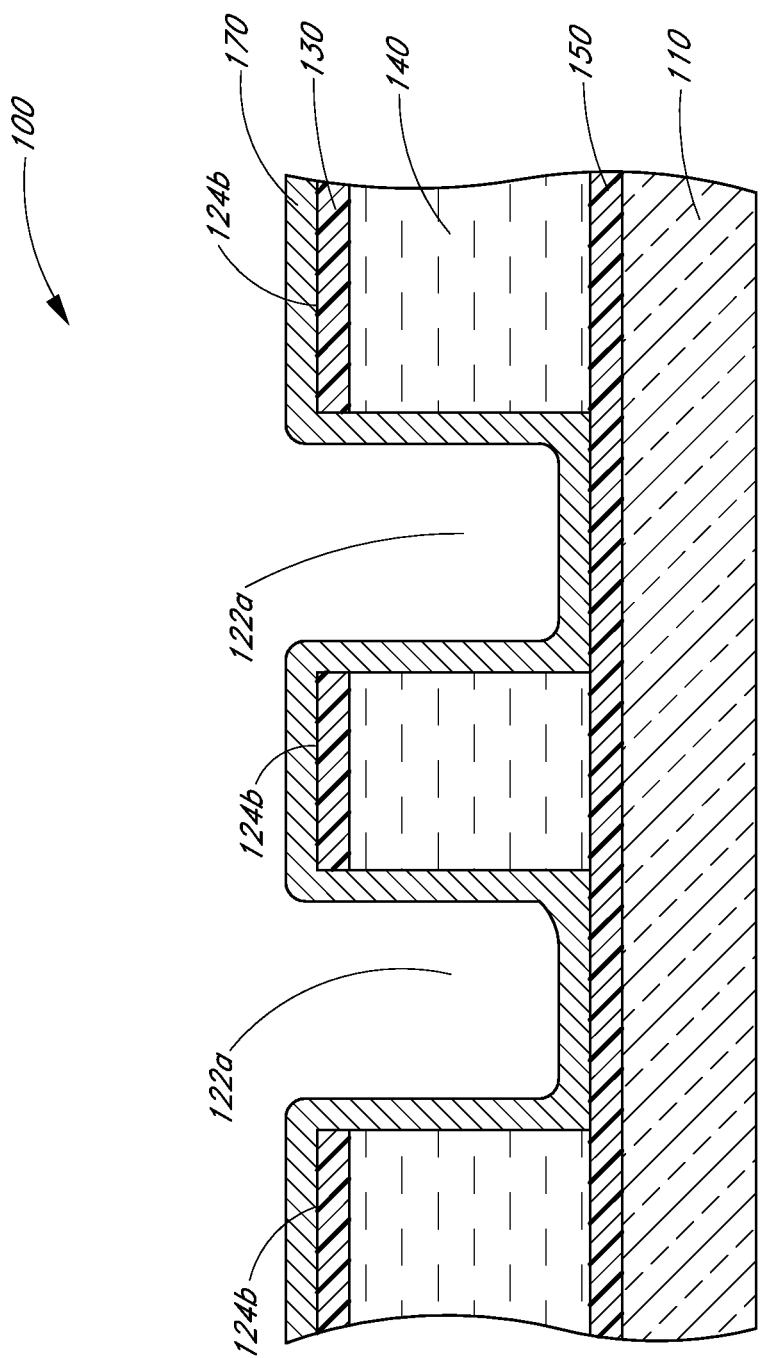
FIG. 7 is a schematic, cross-sectional side view of the partially formed memory device of FIG. 6 after depositing a blanket layer of a spacer material, in accordance with preferred embodiments of the invention.

The pattern in the (modified) photodefinable layer 120 is preferably transferred to the temporary layer 140 to allow for deposition of a layer 170 of spacer material (FIG. 7). Thus, the temporary layer 140 is preferably formed of a material that can withstand the process conditions for spacer material deposition, discussed below. In other embodiments where the deposition of spacer material is compatible with the photodefinable layer 120, the temporary layer 140 can be omitted and the spacer material can be deposited directly on the photo-defined features 124 or the modified photodefined features 124a of the photodefinable layer 120 itself.

In the illustrated embodiment, in addition to having higher heat resistance than photoresist, the material forming the temporary layer 140 is preferably selected such that it can be selectively removed relative to the material for the spacers 175 (FIGS. 8) and the underlying etch stop layer 150. As noted above, the layer 140 is preferably formed of amorphous carbon.

Figure 5:
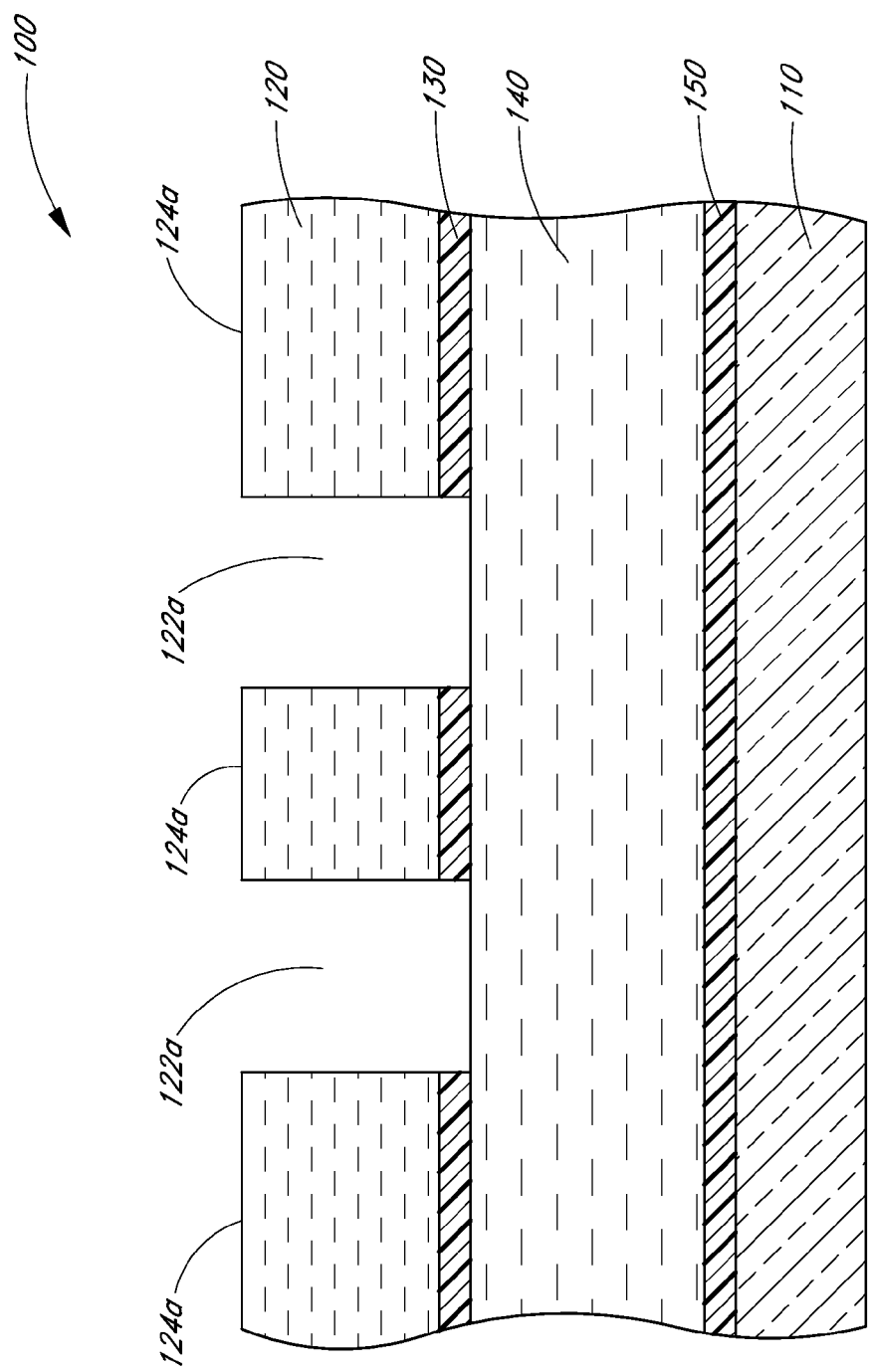
FIG. 5 is a schematic, cross-sectional side view of the partially formed memory device of FIG. 6 after etching through a hard mask layer, in accordance with preferred embodiments of the invention.

The pattern in the photodefinable layer 120 is preferably first transferred to the hard mask layer 130, as shown in FIG. 5. This transfer is preferably accomplished using an anisotropic etch, such as an etch using a fluorocarbon plasma, although a wet (isotropic) etch may also be suitable if the hard mask layer 130 is thin. Preferred fluorocarbon plasma etch chemistries include $CF_4$, $CFH_3$, $CF_2H_2$ and $CF_3H$.

Figure 6:
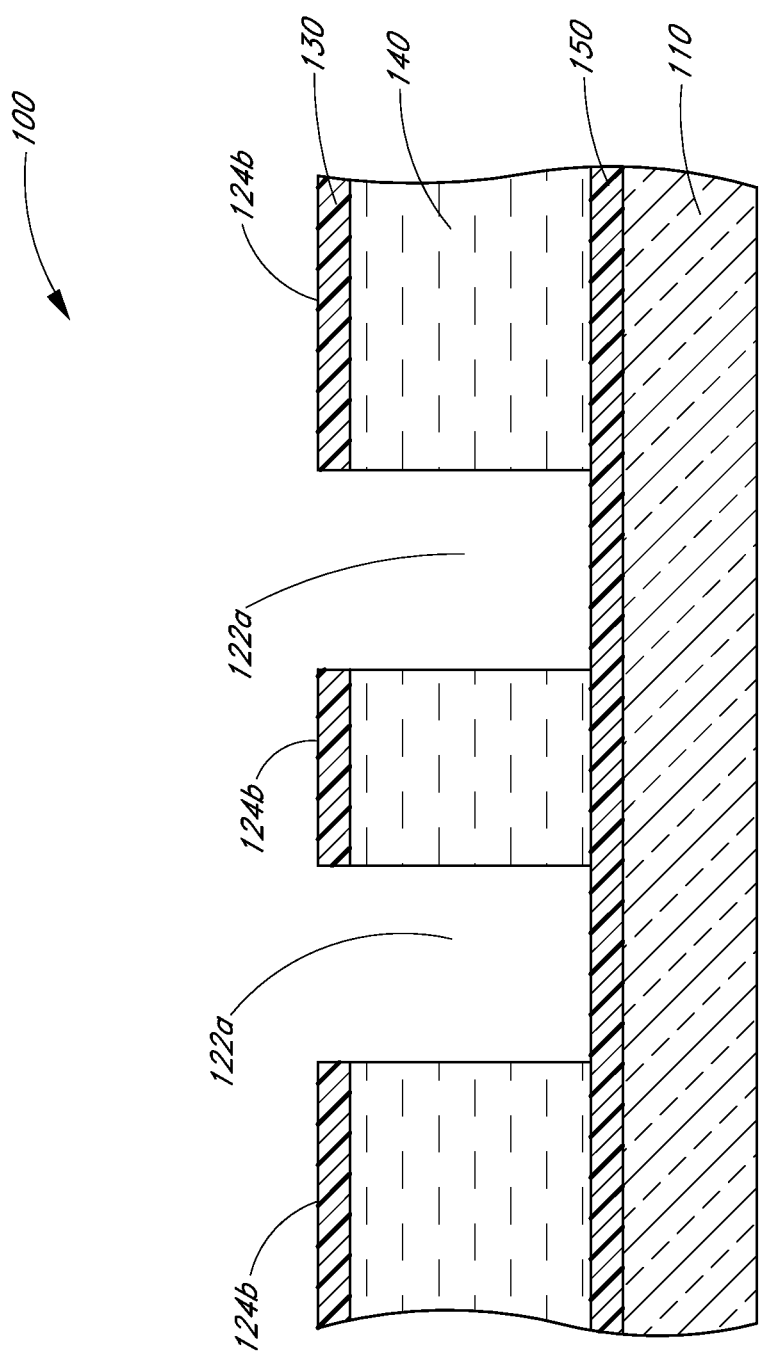
FIG. 6 is a schematic, cross-sectional side view of the partially formed memory device of FIG. 5 after transferring a pattern from the photoresist and hard mask layers to a temporary layer, in accordance with preferred embodiments of the invention.

The pattern in the photodefinable layer 120 is then transferred to the temporary layer 140, as shown in FIG. 6, preferably using a $SO_2$-containing plasma, e.g., a plasma containing $SO_2$, $O_2$ and Ar. Advantageously, the $SO_2$-containing plasma can etch carbon of the preferred temporary layer 140 at a rate greater than 20 times and, more preferably, greater than 40 times the rate that the hard mask layer 130 is etched. A suitable $SO_2$-containing plasma is described in U.S. patent application Ser. No. 10/931,772 of Abatchev et al., filed Aug. 31, 2004, entitled Critical Dimension Control, the entire disclosure of which is incorporate herein by reference. It will be appreciated that the $SO_2$-containing plasma can simultaneously etch the temporary layer 140 and also remove the photodefinable layer 120. The resulting lines 124b constitute the placeholders or mandrels with which a pattern of spacers 175 (FIG. 8) will be formed.

Next, as shown in FIG. 7, a layer 170 of spacer material is preferably blanket deposited conformally over exposed surfaces, including the hard mask layer 130, the hard mask 150 and the sidewalls of the temporary layer 140. Optionally, the hard mask layer 130 can be removed before depositing the layer 170. The spacer material can be any material that can act as a mask for transferring a pattern to the underlying substrate 110, or that otherwise can allow processing of underlying structures through the mask being formed. The spacer material preferably: 1) can be deposited with good step coverage; 2) can be deposited at a temperature compatible with the temporary layer 140; 3) can be further processed to enlarge its dimensions; and 4) can be selectively etched relative to the temporary layer 140 and any layer underlying the temporary layer 140 after being enlarged. Preferred materials include polysilicon and amorphous silicon. The layer 170 is preferably deposited to a thickness of between about 20 nm to about 60 nm and, more preferably, about 20 nm to about 50 nm. Preferably, the step coverage is about 80% or greater and, more preferably, about 90% or greater.

Figure 8:
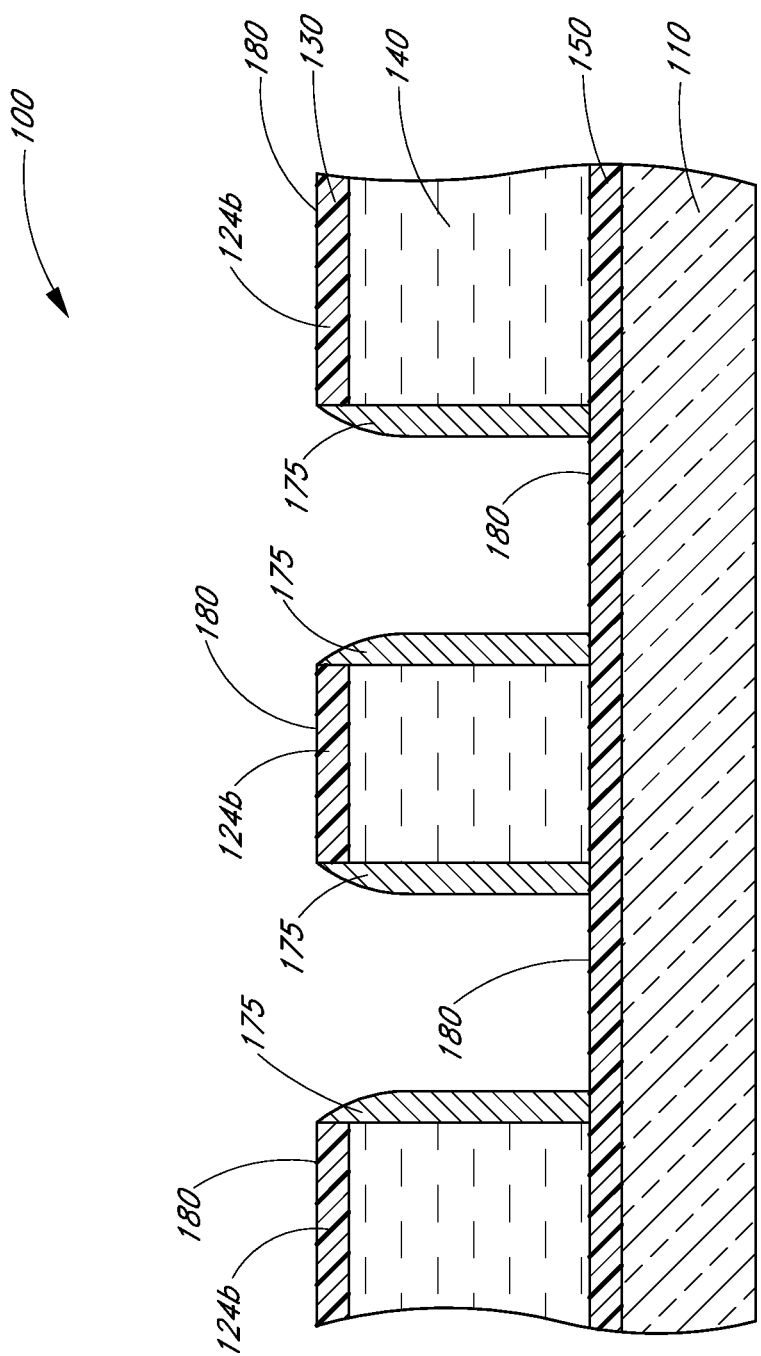
FIG. 8 is a schematic, cross-sectional side view of the partially formed memory device of FIG. 7 after a spacer etch, in accordance with preferred embodiments of the invention.

As shown in FIG. 8, the spacer layer 170 is then subjected to an anisotropic etch to remove spacer material from horizontal surfaces 180 of the partially formed integrated circuit 100. Such an etch, also known as a spacer etch, can be performed using HBr/Cl plasma. The etch can include a physical component and preferably also includes a chemical component, e.g., a reactive ion etch (RIE), such as a $Cl_2$, HBr etch. Such an etch can be performed, for example, using a LAM TCP9400 flowing about 0-50 sccm $Cl_2$ and about 0-200 sccm HBr at about 7-60 mTorr pressure with about 300-1000 W top power and about 50-250 W bottom power.

Figure 9:
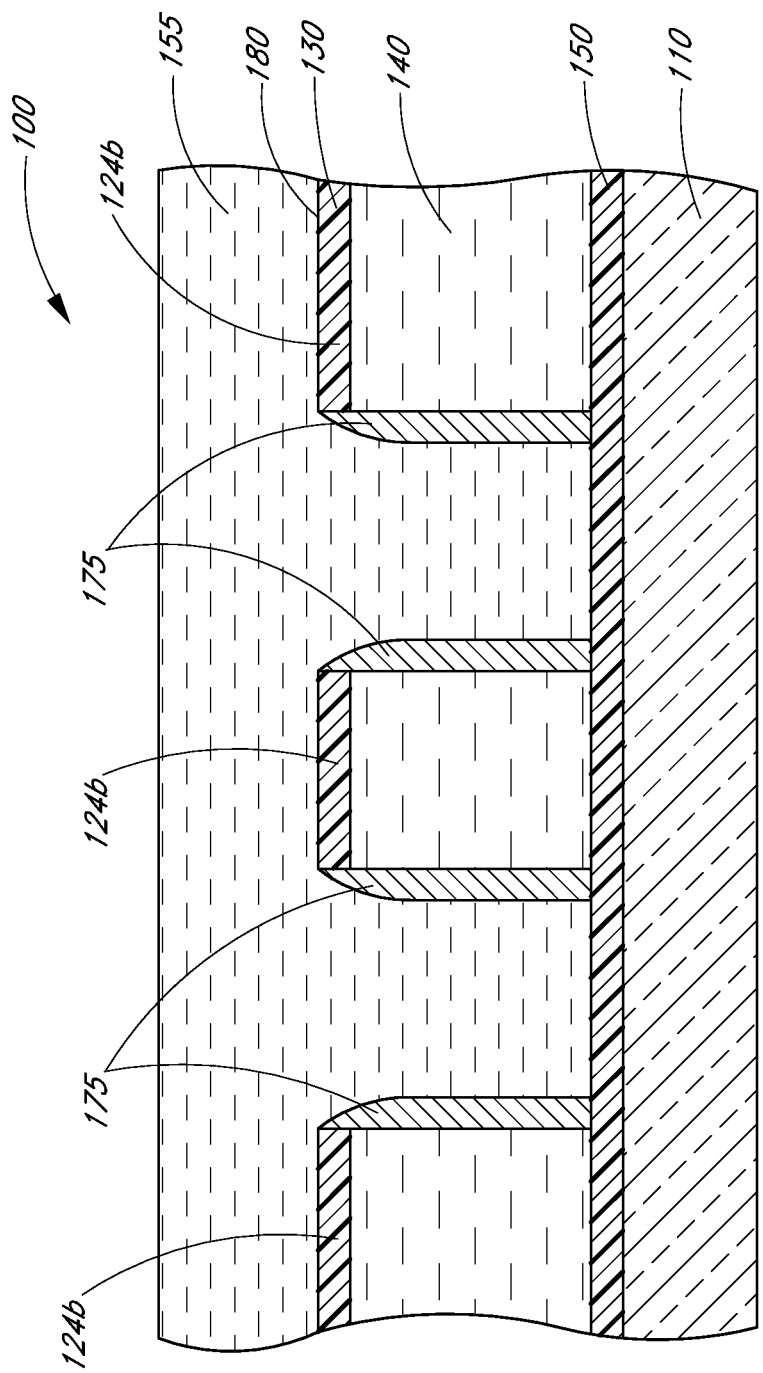
FIG. 9 is a schematic, cross-sectional side view of the partially formed memory device of FIG. 8 after being coated with a removable material, in accordance with preferred embodiments of the invention.
Figure 11:
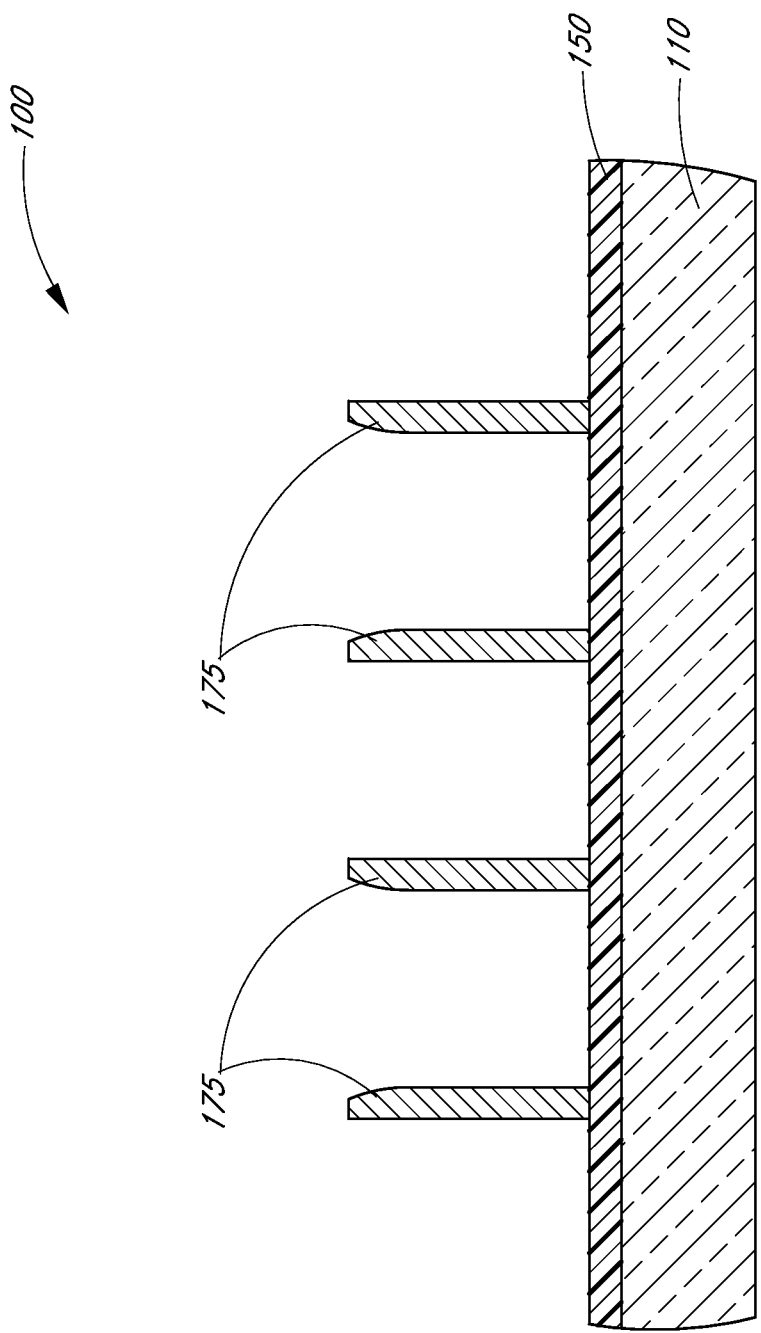
FIG. 11 is a schematic, cross-sectional side view of the partially formed memory device of FIG. 10 after removing the photoresist and temporary layers, in accordance with preferred embodiments of the invention.

The hard mask layer 130 (if still present) and the temporary layer 140 are next removed to leave free standing spacers 175 (FIG. 11). Because the spacers 175 may be thin and because the hard mask layer 130 may be formed of a material similar to the spacers 175, a space-fill layer 155 may be formed over and around the spacers 175 to help maintain the structural integrity of the spacers 175 and to aid in etching the layers 130 and 140, as shown in FIG. 9. Preferably, the layer 155 comprises photoresist, which can be deposited in a spin-on process. In other embodiments, e.g., where the spacers 175 are sufficiently wide and where adequate etch chemistries are available, the layers 130 and 140 may be removed without deposition of the layer 155.

Figure 10:
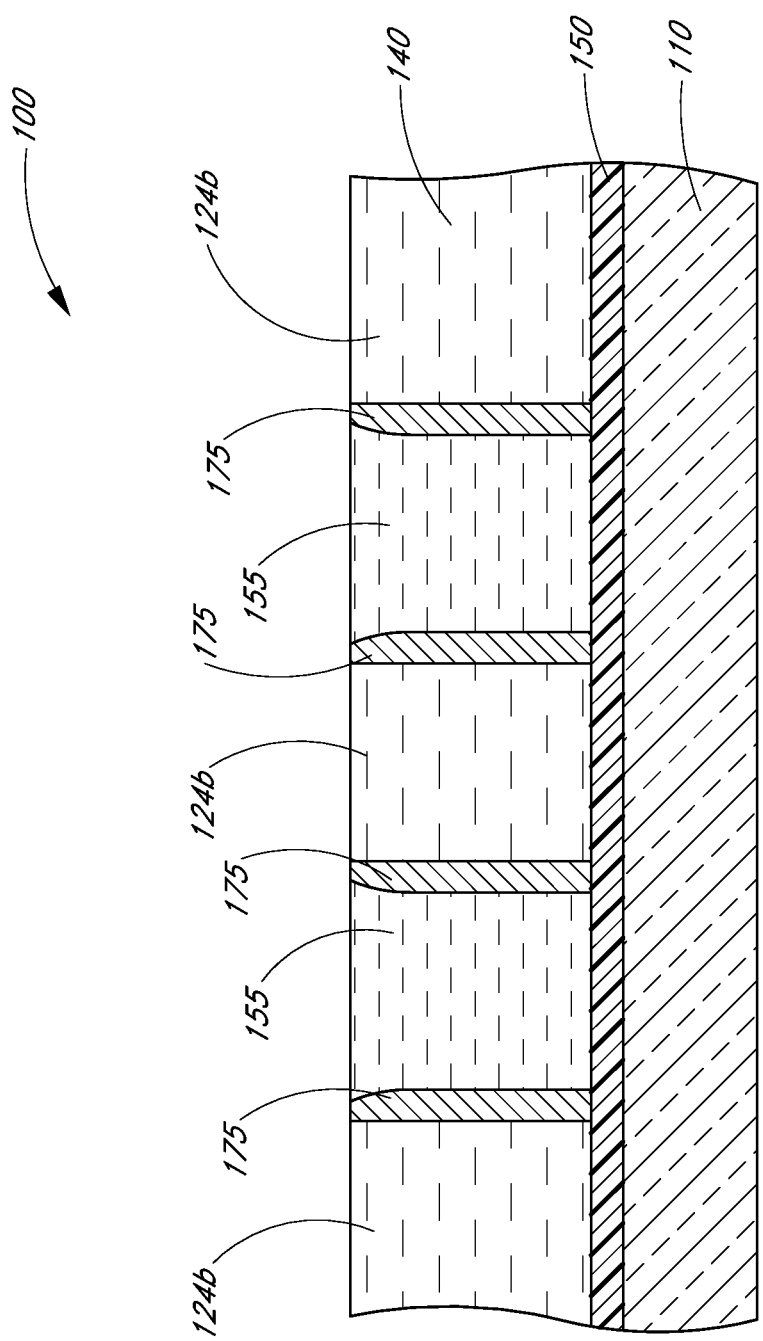
FIG. 10 is a schematic, cross-sectional side view of the partially formed memory device of FIG. 9 after etching the photoresist and hard mask layers, in accordance with preferred embodiments of the invention.

With reference to FIG. 10, the hard mask layer 130, along with a top portion of the space-fill layer 155, is removed, for example, by planarization. Preferred chemistries for etching the layers 130 and 155 include a two step etch: first using $CF_4$/He plasma until the layer 130 (FIG. 9) is removed and then using an $O_2$ plasma to remove the temporary layer 140, along with a remaining portion of the space-fill layer 155. The resulting structure is shown in FIG. 11. Alternatively, to remove the layer 130 in the first part of the etch, the layers 130 and 155 can be subjected to chemical mechanical polishing.

Thus, a pattern of freestanding spacers 175 is formed. Preferred chemistries for etching the layers 140 and 155 include a sulfur oxide plasma etch. Advantageously, silicon is more readily etched, either isotropically and anisotropically, than materials, such as silicon nitrides or silicon oxides, that are typically used for spacers. In some embodiments, the critical dimension of the spacers 175 is adjusted after the spacer etch by trimming the spacers 175.

Thus, pitch multiplication has been accomplished. In the illustrated embodiment, the pitch of the spacers 175 is roughly half that of the photoresist lines 124 (FIG. 3) originally formed by photolithography. Advantageously, spacers 175 having a pitch of about 100 nm or less can be formed. It will be appreciated that because the spacers 175 are formed on the sidewalls of the features or lines 124b, the spacers 175 generally follow the outline of the pattern of features or lines 124 originally formed in the photodefinable layer 120.

Figure 12:
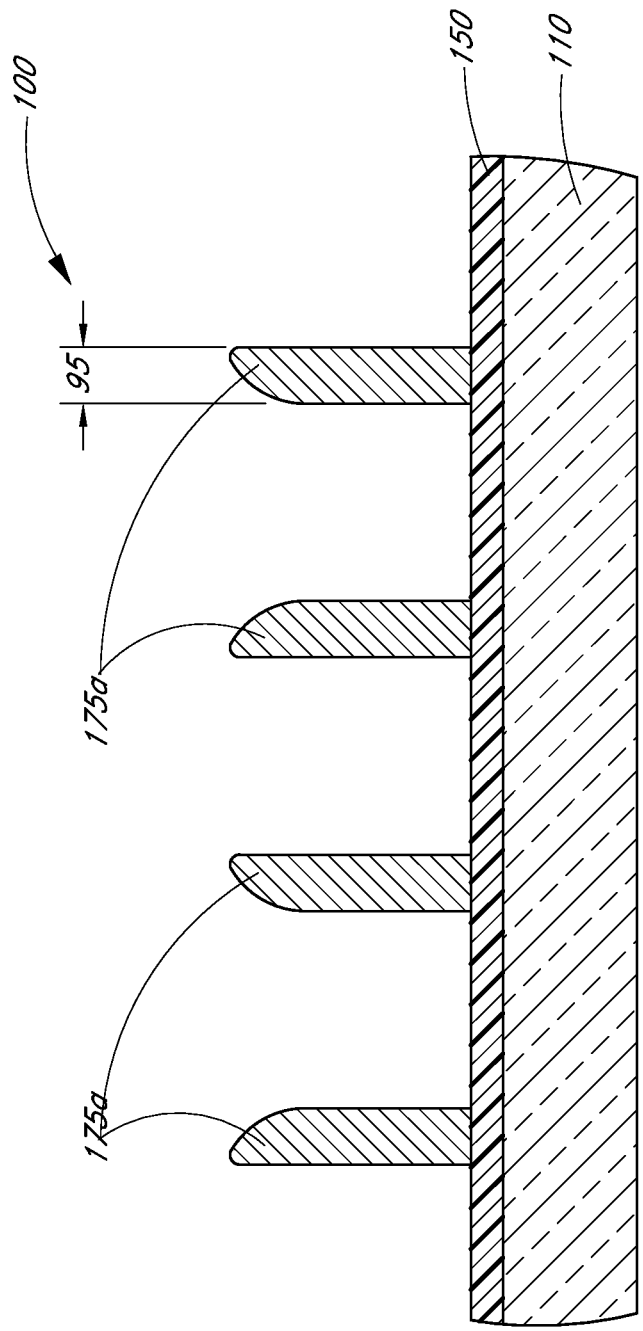
FIG. 12 is a schematic, cross-sectional side view of the partially formed memory device of FIG. 11 after enlarging the spacers to a desired width, in accordance with preferred embodiments of the invention.

Next, in a second phase of methods according to the preferred embodiments, the spacers 175 are enlarged so that their widths correspond to the desired critical dimensions of features that are to be formed in the substrate 110. Preferably, this enlargement is accomplished by reacting the spacers 175 to form a new compound or alloy occupying more space. In the illustrated embodiment having spacers formed of silicon, the enlargement process preferably comprises oxidation of the spacers. It will be appreciated that the spacers 175 grow upon being oxidized, as shown in FIG. 12. The size of the spacers 175a will vary depending upon the extent to which the spacers 175 are oxidized. Thus, the duration and degree of the oxidation is preferably chosen so that the spacers 175 reach a desired width 95. The oxidation of the spacers 175 can be accomplished by any oxidation process known in the art, including thermal oxidation, oxidation using oxygen radicals or plasma, etc. In other embodiments, the spacers 175 can be enlarged by being nitrided by any nitridation process known in the art. Thus, a pattern of spacers 175a having desired widths 95 can be formed.

It will be appreciated that the spacers 175 can be formed of any material that can be expanded, can be conformally deposited and for which suitable etch chemistries are available. For example, the spacers 175 can be formed using titanium and can be enlarged by oxidation or nitridation to form $TiO_2$ or $TiN_2$. Other examples of materials include tantalum (which can be expanded by oxidation or nitridation to form tantalum oxide or tantanlum nitride) and tungsten (which can be expanded by oxidation or nitridation to form tungsten oxide or tungsten nitride).

Preferably, the extent of the enlargement is chosen such that the spacers 175 are enlarged to a width substantially equal to the desired critical dimension of the features, such as interconnects, word lines, bit lines, transistor rows, or gaps between damascene lines, which will be patterned in the substrate 110 using the pattern formed by the spacers 175a. For example, the spacers 175a can be oxidized to a greater or less extent, depending upon whether the desired critical dimensions are only slightly or more substantially greater than the dimensions of the non-oxidized spacers 175. Thus, process conditions, such as duration, chemical reactivity, temperature, etc., are chosen to achieve the desired degree of spacer expansion.

It will be appreciated that growth of the spacers 175 will also narrow the space separating those spacers 175. Preferably, the spacers 175 are positioned to account for this narrowing. In addition, the critical dimension of the spacers 175a can adjusted after the expansion by trimming the spacers 175a, e.g., with an isotropic etch.

Figure 13:
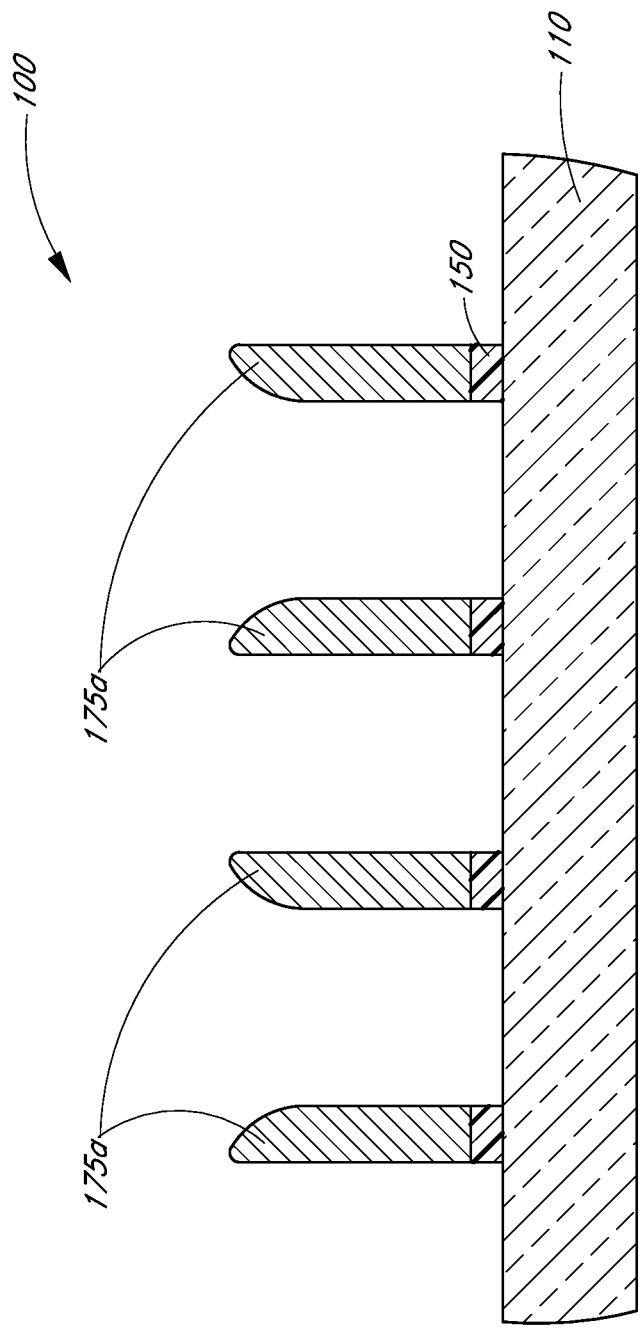
FIG. 13 is a schematic, cross-sectional side view of the partially formed memory device of FIG. 12 after transferring the spacer pattern to an underlying hard mask layer, in accordance with preferred embodiments of the invention.

It will also be appreciated that the spacers 175a themselves may be used directly as a hard mask to pattern an underlying substrate 110. Preferably, however, the pattern of the spacers 175a is transferred to one or more underlying layers which offer better etch selectivity to the substrate 110 than the spacers 175a. With reference to FIG. 13, the pattern made out by the spacers 175a can be transferred to the second hard mask layer 150. Preferably, the second hard mask layer 150 is etched using a $BCl_3/Cl_2$ plasma etch.

Figure 14:
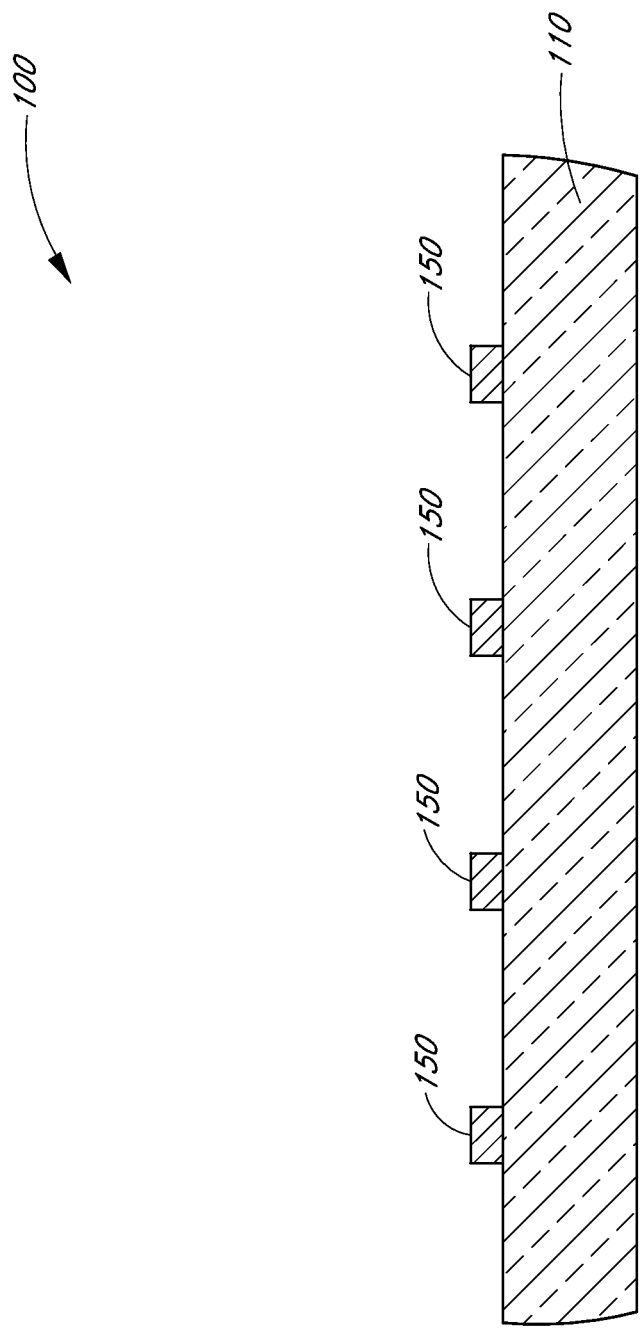
FIG. 14 is a schematic, cross-sectional side view of the partially formed memory device of FIG. 13 after removing the spacers, in accordance with preferred embodiments of the invention.

With reference to FIG. 14, the spacers 175a can optionally be removed before patterning the substrate 110. The spacers 175a can be removed using a wet etch process. Advantageously, by removing the spacers 175a, the aspect ratio of the mask overlying the substrate 110 is reduced, thereby allowing etchants other processing chemicals to more easily reach the substrate and, so, improving the formation of vertical sidewalls or otherwise clearly delineating and completing processing.

Figure 15:
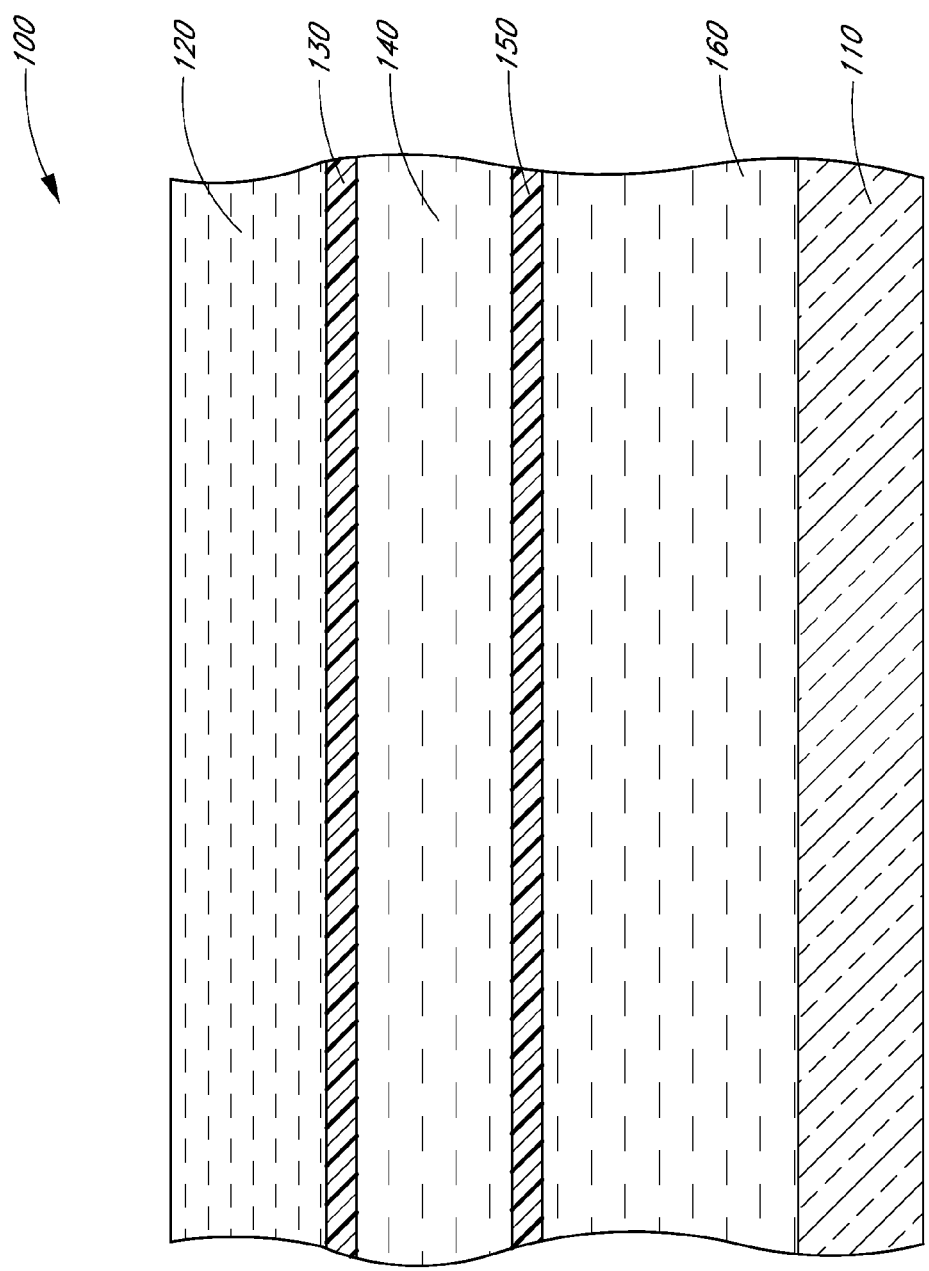
FIG. 15 is a schematic, cross-sectional side view of the partially formed memory device of FIG. 1 having an additional masking layer, in accordance with preferred embodiments of the invention.

In other embodiments, as shown in FIG. 15, an additional mask layer 160 can be utilized to pattern difficult to pattern substrates 110. Such substrates can include, for example, multiple layers, which require multiple successive etches to pattern. Due to the availability of chemistries that allow very selective removal of amorphous carbon relative to many silicon-containing substrate materials, the additional mask layer 160 is preferably formed of amorphous carbon.

Figure 16:
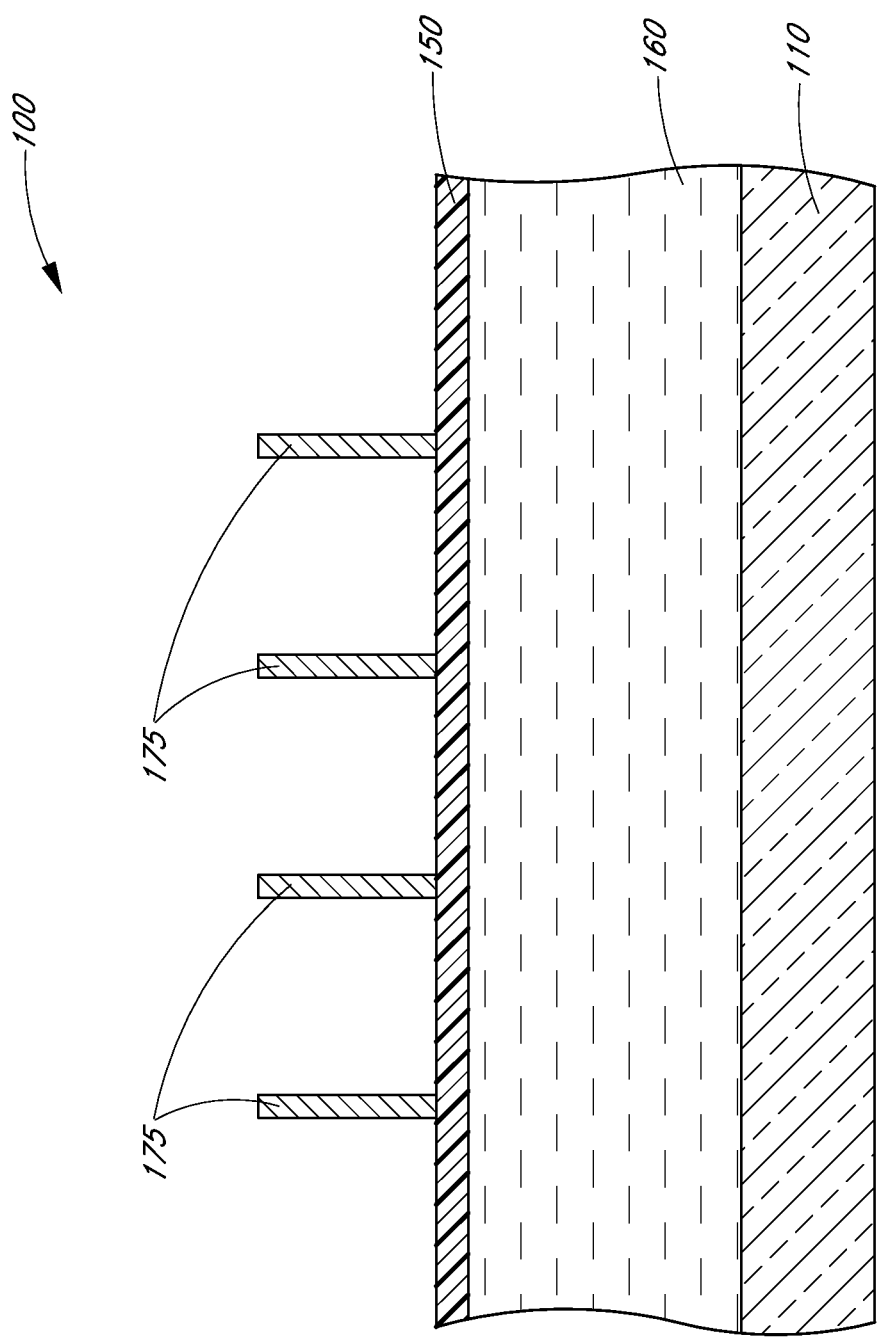
FIG. 16 is a schematic, cross-sectional side view of the partially formed memory device of FIG. 15 after forming spacers, in accordance with preferred embodiments of the invention.
Figure 17:
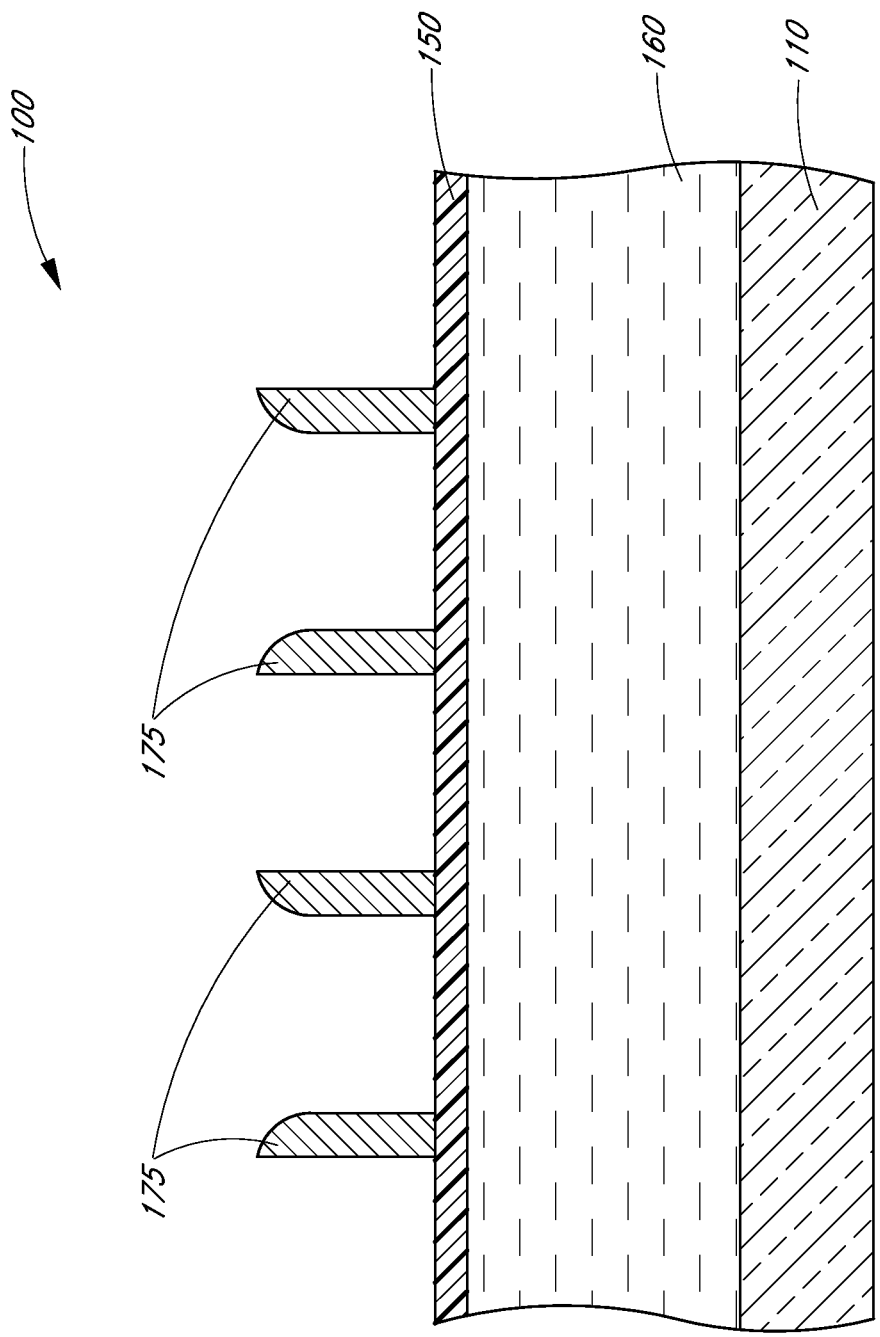
FIG. 17 is a schematic, cross-sectional side view of the partially formed memory device of FIG. 16 after expanding spacers, in accordance with preferred embodiments of the invention.
Figure 18:
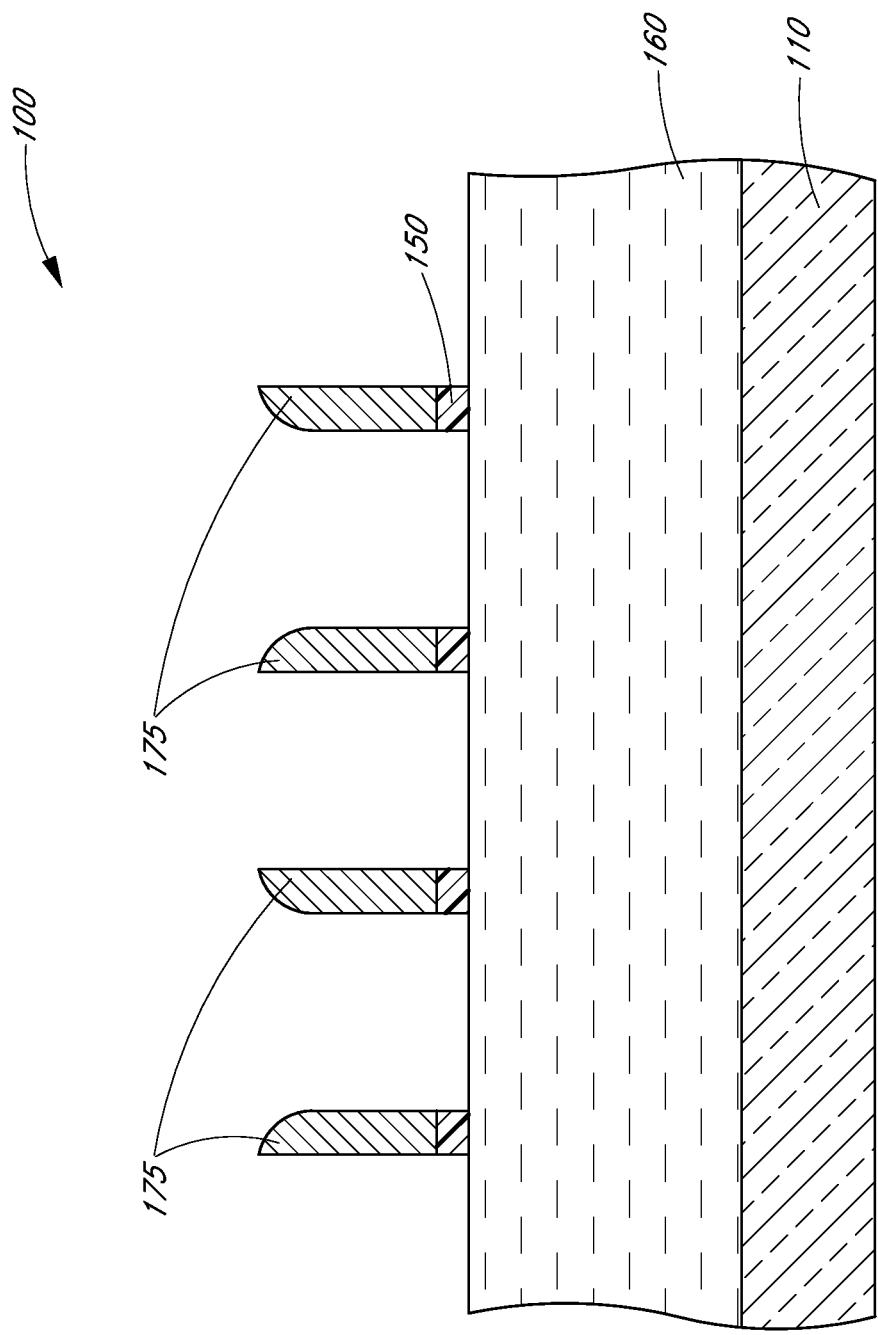
FIG. 18 is a schematic, cross-sectional side view of the partially formed memory device of FIG. 17 after etching through a hard mask layer, in accordance with preferred embodiments of the invention.
Figure 19:
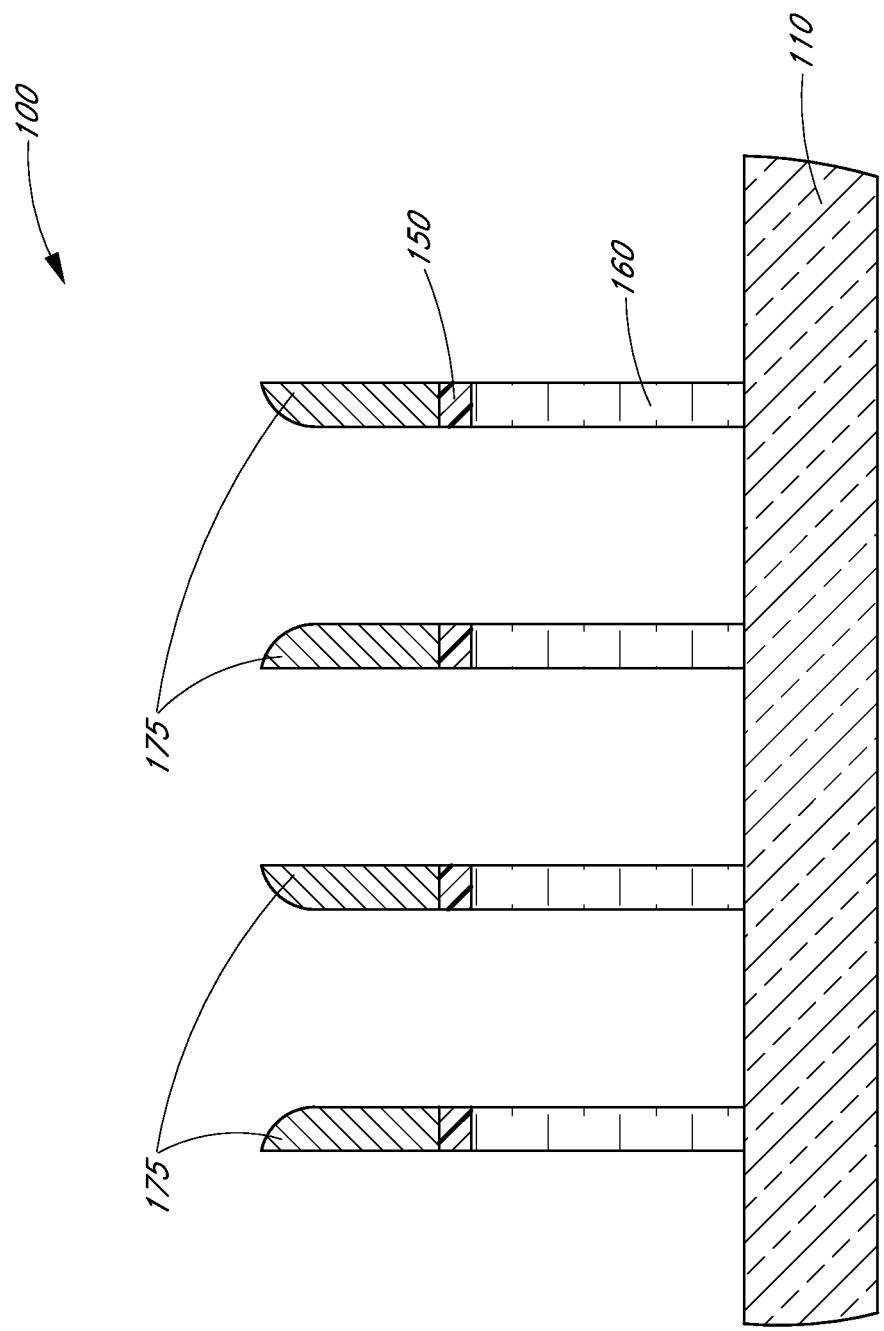
FIG. 19 is a schematic, cross-sectional side view of the partially formed memory device of FIG. 18 after transferring the spacer pattern to the additional masking layer, in accordance with preferred embodiments of the invention.

It will be appreciated that the steps discussed above may be applied to form spacers 175a overlying the additional mask layer 160. With reference to FIG. 16, a pattern of spacers 175 is formed. As shown in FIG. 17, the spacers 175 are then expanded, by, e.g., oxidation, to a desired width, as discussed above. The pattern of spacers 175a can then be transferred to the second hard mask layer 150, preferably using a $BCl_3/Cl_2$ plasma etch, as shown in FIG. 18. The pattern is then transferred to the additional mask layer 160, preferably by anisotropically etching the additional mask layer 160, as shown in FIG. 19. Preferably, the anisotropic etch is comprises exposing the additional mask layer 160 to a $SO_2$-containing plasma. In other embodiments, it will be appreciated that the spacers 175 may be removed before etching the layer 150 or before etching the substrate 110, as discussed above with respect to FIG. 14.

The substrate 110 can then be processed through the mask layers 160 and 150 and the spacers 175a to define various features, e.g., transistors, capacitors and/or interconnects. Where the substrate 110 comprises layers of different materials, a succession of different chemistries, preferably dry-etch chemistries, can be used to successively etch through the different layers. It will be appreciated that, depending upon the chemistry or chemistries used, the spacers 175a and the hard mask layer 150 may be etched. Amorphous carbon of the additional mask layer 160, however, advantageously offers excellent resistance to conventional etch chemistries, especially those used for etching silicon-containing materials. Accordingly, the additional mask layer 160 can effectively be used as a mask for etching through a plurality of substrate layers, or for forming high aspect ratio trenches. The additional mask layer 160 can later be removed for further processing of the substrate 110.

It will be appreciated that, in any of the steps described herein, transferring a pattern from a first level to a second level involves forming features in the second level that generally correspond to features on the first level. For example, the path of lines in the second level will generally follow the path of lines on the first level and the location of other features on the second level will correspond to the location of similar features on the first level. The precise shapes and sizes of features can vary from the first level to the second level, however. For example, depending upon etch chemistries and conditions, the sizes of and relative spacings between the features forming the transferred pattern can be enlarged or diminished relative to the pattern on the first level, while still resembling the same initial "pattern." Thus, the transferred pattern is still considered to be the same pattern as the initial pattern. In contrast, forming spacers around mask features can change the pattern.

It will be appreciated that formation of contacts according to the preferred embodiments offers numerous advantages. For example, because thinner layers are more easily conformally deposited than thicker layers, the layers of spacer material from which spacers are formed can be deposited with improved conformality. As a result, spacers can be formed from these layers with improved uniformity. Moreover, the relative thinness of these layers reduces the aspect ratios of trenches lined with the blanket layer of spacer material, thereby allowing etchants to more easily penetrate to the bottom of the trenches and, thus, facilitating the spacer etch.

It will also be appreciated that various modifications of the illustrated embodiments are possible. For example, the pitch of the spacers 175 or 175a can be more than doubled. Further pitch multiplication can be accomplished by forming additional spacers around the spacers 175 or 175a, then removing the spacers 175 or 175a, then forming spacers around the spacers that were formerly around the spacers the 175 or 175a, and so on. An exemplary method for further pitch multiplication is discussed in U.S. Pat. No. 5,328,810 to Lowrey et al.

In addition, various other patterns, for patterning features of different sizes, can be overlaid or formed adjacent to the spacers 175 or 175a. For example, an additional photodefinable layer can be formed overlying the spacers 175 or 175a and then patterned to form the other patterns. Methods for forming such patterns are disclosed in U.S. patent application Ser. No. 10/931,771 of Tran et al., filed Aug. 31, 2004, entitled Methods for Increasing Photo-Alignment Margins, the entire disclosure of which is incorporated herein by reference.

Moreover, while all the spacers 175 can be oxidized to have a similar width, in other embodiments, only some of the spacers 175 may be oxidized. For example, some spacers 175 can be protected from oxidation by depositing and patterning a protective layer (for which selective etch chemistries are available) and then oxidizing exposed spacers.

In addition, depending upon the material being converted and the extent of the conversion process, the oxidation or subsequent chemical conversion process may not appreciably increase the size of the spacers 175. In such case, the processes disclosed herein can nevertheless be applied to convert the spacers 175 to a material for which highly selective etch chemistries are available. As such, the conversion process can advantageously convert the spacers 175 to a better etch stop for subsequent etch steps. For example, a mask precursor material can be converted to a silicon or metal oxide or nitride, which can advantageously provide good etch selectivity to surrounding, i.e., underlying, materials.

Figure 20:
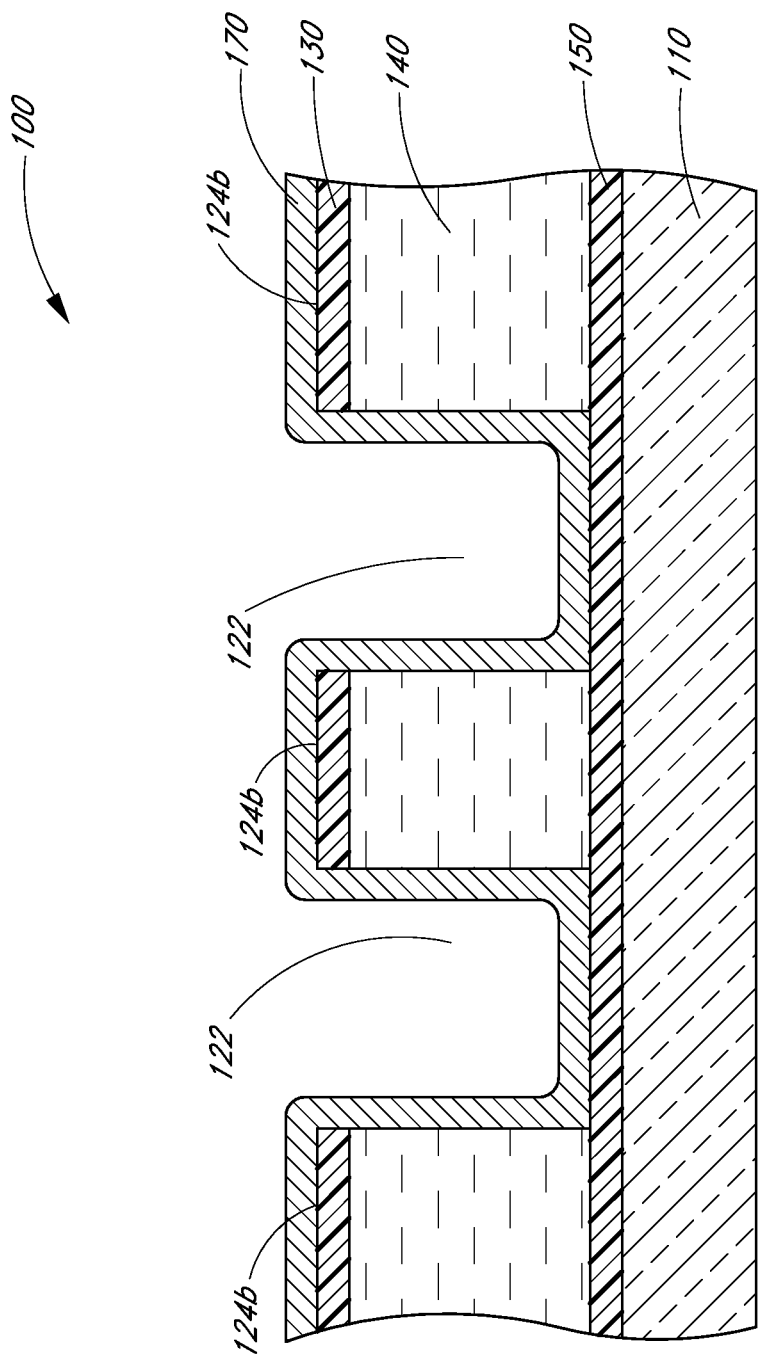
FIG. 20 is a schematic, cross-sectional side view of the partially formed memory device of FIG. 6 after depositing a blanket layer of a spacer material, in accordance with other preferred embodiments of the invention.
Figure 21:
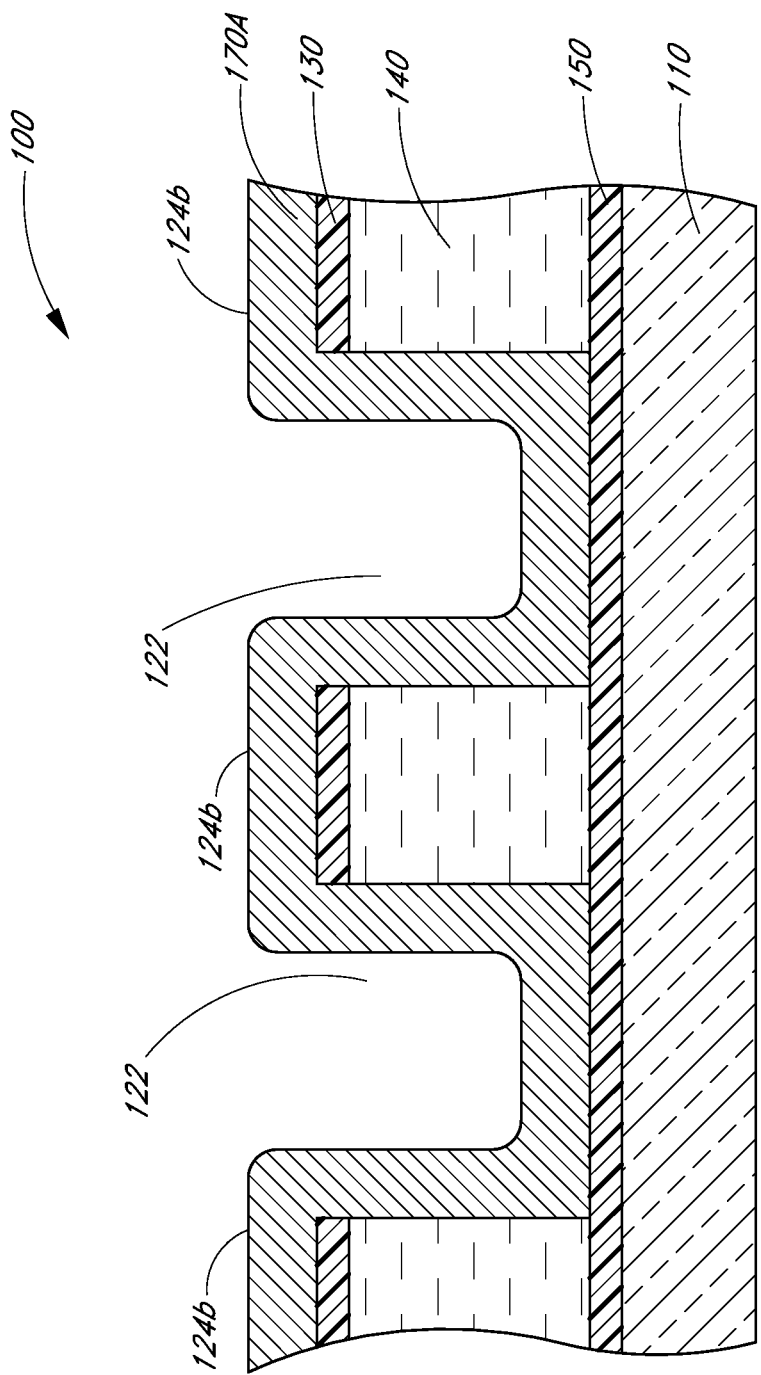
FIG. 21 is a schematic, cross-sectional side view of the partially formed memory device of FIG. 20 after enlarging the blanket layer to a desired thickness, in accordance with other preferred embodiments of the invention.
Figure 22:
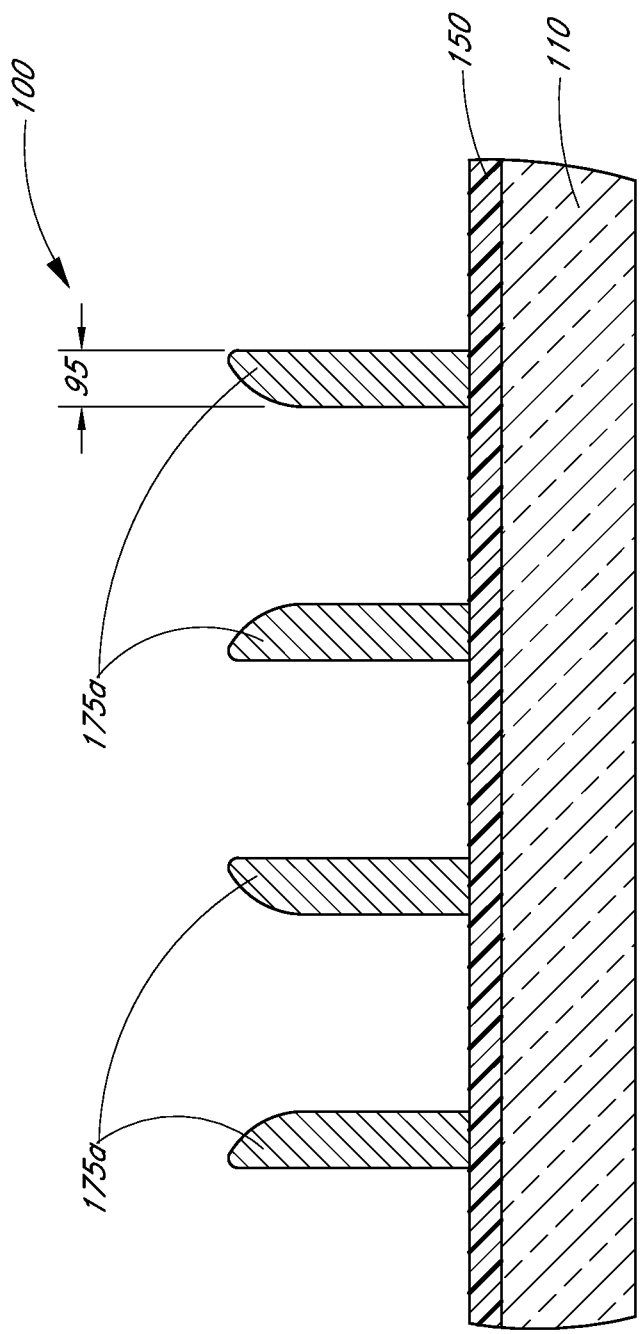
FIG. 22 is a schematic, cross-sectional side view of the partially formed memory device of FIG. 21 after removing the hard mask and temporary layers, in accordance with other preferred embodiments of the invention.

With reference to FIGS. 20-22, where the spacers 175 are enlarged, it will be appreciated that the spacers 175 or the layer 170 can be enlarged, e.g., by oxidation, at any point after deposition of the spacer material and before forming the free-standing spacers 175. For example, after depositing a blanket layer of spacer material 170 (FIG. 20), the entire blanket layer 170 can be expanded, as shown in FIG. 21 to form an expanded blanket layer 170a. As noted above, the expansion process, including process conditions (e.g., duration, chemical reactivity, temperature, etc.), is preferably chosen such that the blanket layer 170 expands to a desired thickness corresponding to a desired critical dimension, taking into account any horizontal shrinkage during the subsequent spacer etch. Thus, the expansion process may leave the layer 170 only partially oxidized. As shown in FIG. 22, after a spacer etch, the mandrels 124b are then removed to leave the free-standing spacers 175a. Advantageously, because the spacers 175a are thicker than the spacers 175, a protective space-fill layer 155 (FIG. 9) may not necessary and the mandrels 124b can be etched using an anisotropic etch, e.g., using a fluorocarbon plasma.

In other embodiments, the spacers 175 can be expanded after the spacer etch and before etching the mandrels (e.g., the spacers 175 in the FIG. 8 can be expanded). Advantageously, because the spacers 175 are allowed to grow laterally in only one direction, this type of expansion allows the distance between individual pairs of spacers 175 to be maintained constant, while reducing the distance between the constituent spacers of a pair of spacers 175. As noted above, however, the expansion step is preferably performed after forming the spacers 175 as freestanding structures, to facilitate etching of the layer 170.

Also, while "processing" through the various mask layers preferably involve etching an underlying layer, processing through the mask layers can involve subjecting layers underlying the mask layers to any semiconductor fabrication process. For example, processing can involve doping, oxidation, nitridation or depositing materials through the mask layers and onto underlying layers.

Accordingly, it will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method of semiconductor processing, comprising:
providing a substrate, wherein a temporary layer overlies the substrate and a photodefinable layer overlies the temporary layer;
forming a pattern in the photodefinable layer;
transferring the pattern to the temporary layer to form a plurality of placeholders in the temporary layer;
depositing a blanket layer of spacer material over the plurality of placeholders;
selectively removing the spacer material from horizontal surfaces;
selectively removing the placeholders relative to the spacer material;
expanding a volume of the spacer material, the expanded spacer material forming spacers; and
transferring a pattern defined by the spacers to the substrate.

2. The method of claim 1, wherein selectively removing the placeholders comprises:
depositing a filler material over and around the spacer material; and
subsequently simultaneously etching the filler material and the temporary layer.

3. The method of claim 2, wherein depositing a filler material comprises depositing photoresist.

4. The method of claim 1, wherein selectively removing the placeholders forms a pattern of free-standing spacers and wherein expanding the volume of the spacer material is performed after selectively removing the placeholders.

5. The method of claim 1, wherein transferring a pattern defined by the spacers to the substrate comprises:
providing one or more masking layers under a level of the spacer material;
transferring the pattern defined by the spacers to the one or more masking layers; and
transferring the pattern defined by the spacers from the one or more masking layers to the substrate.

6. The method of claim 1, wherein expanding the volume of the spacer material is performed before selectively removing the spacer material from horizontal surfaces.

7. The method of claim 1, wherein expanding the volume of the spacer material is performed after selectively removing the spacer material from horizontal surfaces and before selectively removing the placeholders.

8. The method of claim 1, wherein the temporary layer comprises amorphous carbon.

9. The method of claim 8, wherein the photodefinable layer comprises photoresist.

10. The method of claim 9, wherein forming a pattern in the photodefinable layer comprises performing photolithography and subsequently isotropically etching the photodefinable layer.

11. The method of claim 9, wherein a hard mask layer separates the temporary layer and the photodefinable layer.

12. The method of claim 1, wherein depositing a blanket layer of spacer material comprises depositing a layer of silicon by chemical vapor deposition.

13. The method of claim 12, wherein expanding the volume of the spacer material comprises forming silicon oxide.

14. The method of claim 12, wherein selectively removing the spacer material from horizontal surfaces comprises anisotropically etching the silicon layer.

15. A method of semiconductor processing, comprising:
defining a plurality of spaced-apart placeholders using photolithography;
blanket depositing a layer of spacer material on the placeholders;
etching the layer of spacer material to define spacers on sidewalls of the placeholders;
subsequently selectively removing the placeholders;
expanding a volume of the spacer material forming the spacers;
providing a photodefinable layer extending over the spacers; and
patterning the photodefinable layer.

16. The method of claim 15, wherein expanding the volume of the spacer material comprises converting the spacer material to a material having a larger volume than the spacer material, wherein expanding the volume is performed before subsequently selectively removing the placeholders.

17. The method of claim 15, wherein expanding the volume of the spacer material is performed after subsequently selectively removing the placeholders.

18. The method of claim 15, wherein expanding a volume of the spacer material comprises exposing the spacer material to an oxidant.

19. The method of claim 15, wherein expanding a volume of the spacer material comprises exposing the spacer material to a nitrogen-containing precursor.

20. The method of claim 15, wherein defining a plurality of spaced-apart placeholders using photolithography comprises:
providing a layer of photoresist over a layer of temporary material;
patterning the photoresist;
transferring a pattern in the photoresist layer to the layer of temporary material to define the placeholders; and
removing the photoresist.

21. The method of claim 15, wherein a pitch of the spacers is about 100 nm or less.

* * * * *

UNITED STATES PATENT AND TRADEMARK OFFICE
CERTIFICATE OF CORRECTION

| | |
|---|---|
| PATENT NO. | : 8,486,610 B2 |
| APPLICATION NO. | : 13/024166 |
| DATED | : July 16, 2013 |
| INVENTOR(S) | : Mirzafer K. Abatchev et al. |

It is certified that error appears in the above-identified patent and that said Letters Patent is hereby corrected as shown below:

In the Claims:

In column 16, line 24, in Claim 20, delete "photoreist" and insert -- photoresist --, therefor.

In column 16, line 26, in Claim 20, delete "photoreist" and insert -- photoresist --, therefor.

Signed and Sealed this
Twenty-ninth Day of October, 2013

Teresa Stanek Rea
*Deputy Director of the United States Patent and Trademark Office*